United States Patent
Solari et al.

(10) Patent No.: US 9,871,162 B2
(45) Date of Patent: Jan. 16, 2018

(54) METHOD OF GROWING NITRIDE SINGLE CRYSTAL AND METHOD OF MANUFACTURING NITRIDE SEMICONDUCTOR DEVICE

(71) Applicant: SAMSUNG ELECTRONICS CO., LTD., Suwon-si, Gyeonggi-do (KR)

(72) Inventors: William Solari, Hwaseong-si (KR); Min Ho Kim, Hwaseong-si (KR); Heon Ho Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/594,058

(22) Filed: Jan. 9, 2015

(65) Prior Publication Data
US 2015/0311380 A1    Oct. 29, 2015

(30) Foreign Application Priority Data
Apr. 25, 2014    (KR) .................. 10-2014-0049984

(51) Int. Cl.
*H01L 33/00*    (2010.01)
*H01L 21/02*    (2006.01)

(52) U.S. Cl.
CPC ........ *H01L 33/007* (2013.01); *H01L 21/0254* (2013.01); *H01L 21/0262* (2013.01);
(Continued)

(58) Field of Classification Search
CPC ... H01L 33/00; H01L 33/007; H01L 33/0025; H01L 33/0066; H01L 33/30; H01L 33/32;
(Continued)

(56) References Cited

U.S. PATENT DOCUMENTS 5,281,830 A * 1/1994 Kotaki .................. H01L 33/007
                                                                257/103
6,372,608 B1    4/2002 Shimoda et al.
(Continued)

FOREIGN PATENT DOCUMENTS

EP        2541589 A1        1/2013
KR    20120084119 A  *    7/2012
(Continued)

OTHER PUBLICATIONS

Y. S. Cho, et al., "Morphology development of GaN grown with different carrier gases," Laytec's 8th in-situ Seminar, Mar. 2007, Bratislava, Slovakia, Institue of Bio-and Nanosystems (IBN-1), Center of Nanoelectronic Systems for Information Technology (CNI), Research Center Julich, Germany.
(Continued)

*Primary Examiner* — Natalia Gondarenko
(74) *Attorney, Agent, or Firm* — Lee & Morse, P.C.

(57) ABSTRACT

A method of growing a Group-III nitride crystal includes forming a buffer layer on a silicon substrate and growing a Group-III nitride crystal on the buffer layer. The method of growing of a Group-III nitride crystal is executed through metal-organic chemical vapor deposition (MOCVD) during which a Group-III metal source and a nitrogen source gas are provided. The nitrogen source gas includes hydrogen ($H_2$) and at least one of ammonia ($NH_3$) and nitrogen ($N_2$). At least a partial stage of the operation of growing the Group-III nitride crystal can be executed under conditions in which a volume fraction of hydrogen in the nitrogen source gas ranges from 20% to 40% and a temperature of the silicon substrate ranges from 950° C. to 1040° C.

10 Claims, 22 Drawing Sheets

(52) U.S. Cl.
CPC .. *H01L 21/02381* (2013.01); *H01L 21/02458* (2013.01); *H01L 21/02507* (2013.01)

(58) Field of Classification Search
CPC ............... H01L 33/42; H01L 21/02505; H01L 21/02631; H01L 21/0254; H01L 21/02458; H01L 21/76898; H01L 29/2003; H01L 29/205; H01L 29/42316; H01L 29/4236; H01L 29/475; H01L 29/66462; H01L 29/7783; H01L 29/7786; H01L 29/7787; H01L 21/02; H01L 21/02005; H01L 21/02027; H01L 21/02104; H01L 21/02367; H01L 21/02378; H01L 21/02381; H01L 21/02647; H01L 21/02507; H01L 21/02387; H01L 21/02389; H01L 21/02428; H01L 21/0243; H01L 21/02433; H01L 21/02436; H01L 21/02455; H01L 21/02518; H01L 21/02521; H01L 21/02538; H01L 21/02617; H01L 21/0262; H01L 21/02625; H01L 21/02634; H01L 21/02636; H01L 2924/12032; H01L 2924/13055; H01L 2924/1305; H01L 2924/13091; H01L 24/83; H01L 2933/0016; H01L 2933/007; H01L 2933/0075; H01L 25/18; H01L 2224/03; H01L 2224/0345; H01L 2224/03622; H01L 2224/45124; H01L 2224/73265; H01L 2224/05124; H01L 2224/92242
USPC ............... 438/253, 22, 478, 604, 47, 46, 930
See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2007/0138505 A1* | 6/2007 | Preble | C30B 25/02 257/190 |
| 2009/0008659 A1* | 1/2009 | Ohno | B82Y 20/00 257/96 |
| 2010/0252835 A1 | 10/2010 | Horie et al. | |
| 2011/0244617 A1 | 10/2011 | Su | |
| 2011/0244663 A1 | 10/2011 | Su | |
| 2012/0258581 A1 | 10/2012 | Brown et al. | |
| 2013/0026480 A1 | 1/2013 | Fenwick et al. | |
| 2013/0026482 A1* | 1/2013 | Fenwick | H01L 21/02381 257/76 |
| 2013/0052804 A1* | 2/2013 | Song | C23C 16/45565 438/478 |
| 2013/0082274 A1 | 4/2013 | Yang et al. | |
| 2013/0171811 A1 | 7/2013 | Suzuki et al. | |
| 2013/0214284 A1* | 8/2013 | Holder | H01L 29/2003 257/76 |
| 2013/0270575 A1 | 10/2013 | Humphreys et al. | |
| 2014/0091314 A1* | 4/2014 | Ishiguro | H01L 29/66462 257/76 |
| 2014/0167114 A1 | 6/2014 | Derluyn et al. | |

FOREIGN PATENT DOCUMENTS

| | | |
|---|---|---|
| WO | 2013/010533 A1 | 1/2013 |
| WO | 2013/010828 A1 | 1/2013 |

OTHER PUBLICATIONS

M. A. Mastro, et al., "Oxynitride mediated epitaxy of gallium nitride on silicon(1 1 1) substrates in a merged hydride/metal-organic vapor phase epitaxy system," Department of Chemical Engineering, University of florida, Gainesville, FL, Materials Science and Engineering B 127 (2006), pp. 91-97, 2005.

K. Takemoto, et al., "Growth of GaN Directly on Si (111) Substrate by Controlling Atomic Configuration of Si Surface Metalorganic Vapor Phase Epitaxy," Japanese Journal of Applied Physics, vol. 45, No. 18, 2006, pp. L478-L481.

* cited by examiner

METHOD OF GROWING NITRIDE SINGLE CRYSTAL AND METHOD OF MANUFACTURING NITRIDE SEMICONDUCTOR DEVICE

CROSS-REFERENCE TO RELATED APPLICATION

This application claims the benefit of priority to Korean Patent Application No. 10-2014-0049984, filed on Apr. 25, 2014, in the Korean Intellectual Property Office, the disclosure of which is incorporated herein by reference in its entirety.

BACKGROUND

The present disclosure relates to a method of growing a nitride single crystal and, more particularly, to a method of growing a nitride single crystal and a method of manufacturing a nitride semiconductor.

A heterogeneous substrate such as a sapphire substrate, a SIC substrate, or the like, is commonly used as a substrate for growing a nitride single crystal. However, such a heterogeneous substrate is costly or has high hardness, making processing difficult. In particular, a sapphire substrate has low electrical conductivity.

In order to overcome such limitations, a scheme of utilizing a silicon substrate to grow a nitride single crystal has been proposed. However, when a nitride single crystal thin film is grown on a silicon substrate, dislocation density is increased due to lattice mismatch between the silicon substrate and the thin film, and plastic deformation cracks may occur due to a difference between coefficients of thermal expansion. As a result, a thin film grown on a silicon substrate may have an uneven thickness. In addition, a silicon element may be diffused to form a eutectic metal with a metal (e.g., gallium) of Group-III nitride, causing a meltback phenomenon.

SUMMARY

The inventive concept(s) described herein provide methods of growing nitride single crystals capable of reducing the rates at which deformations or cracks occur while maintaining crystal quality, and methods of manufacturing nitride semiconductor devices using the same.

According to an exemplary embodiment of the inventive concept provided herein, a method of growing a Group-III nitride semiconductor includes steps of maintaining a substrate containing silicon at a temperature of 950° C. to 1040° C., and growing the Group-III nitride semiconductor, while maintaining the substrate at the temperature, by providing concurrently with a metal source gas, to an interior of a reaction chamber having the substrate, a nitrogen source gas having a volume fraction of hydrogen in a range of 20% to 40%.

The method may further include forming a buffer layer on a surface of the substrate containing silicon, and the step of concurrently providing the metal source gas and the nitrogen source gas while maintaining the substrate at the temperature may be performed to form a Group-III nitride crystal on the buffer layer.

The step of forming the buffer layer may include forming an AlN nucleation layer on the substrate, and forming a lattice buffer layer on the AlN nucleation layer.

The step of forming the Group-III nitride crystal on the buffer layer may include forming, on the lattice buffer layer, a first nitride semiconductor layer having a lattice constant greater than that of the lattice buffer layer; forming, on the first nitride semiconductor layer, an intermediate layer including a nitride crystal having a lattice constant smaller than that of the first nitride semiconductor layer; and forming, on the intermediate layer, a second nitride semiconductor layer having a same composition as the first nitride semiconductor layer. The substrate may be maintained at the temperature of 950° C. to 1040° C. and the nitrogen source gas may be provided with the volume fraction of hydrogen in the range of 20% to 40% through the steps of forming the first nitride semiconductor layer, the intermediate layer, and the second nitride semiconductor layer.

The method may further include forming a stress compensation layer on the buffer layer as part of forming the Group-III nitride crystal, and forming a light emitting structure on the stress compensation layer. The forming a light emitting structure on the stress compensation layer may include forming a first conductivity-type nitride semiconductor layer on the stress compensation layer; forming an active layer on the first conductivity-type nitride semiconductor layer; and forming a second conductivity-type nitride semiconductor layer on the active layer. The substrate may be maintained at the temperature of 950° C. to 1040° C. and the nitrogen source gas may be provided with the volume fraction of hydrogen in the range of 20% to 40% through the steps of forming the stress compensation layer and the first conductivity-type nitride semiconductor layer on the stress compensation layer.

The method may further include mounting the light emitting structure on a permanent substrate by bonding the second conductivity-type nitride semiconductor layer to the permanent substrate, and removing the silicon substrate, the buffer layer, and the stress compensation layer to expose the first conductivity-type nitride semiconductor layer of the light emitting structure.

The method may further include forming a stress compensation layer on the buffer layer as part of forming the Group-III nitride crystal, and forming a light emitting structure on the stress compensation layer. The forming the light emitting structure on the stress compensation layer may include forming a first conductivity-type nitride semiconductor layer on the stress compensation layer; forming, on the first conductivity-type nitride semiconductor layer, a pit formation layer having a plurality of pit indentations; forming a superlattice layer on the pit formation layer so as to maintain the pit indentations in the superlattice layer; forming an active layer on the superlattice layer so as to maintain the pit indentations in the active layer; and forming a second conductivity-type nitride semiconductor layer on the active layer so as to fill the pit indentations in the active layer. The substrate may be maintained at the temperature of 950° C. to 1040° C. and the nitrogen source gas may be provided with the volume fraction of hydrogen in the range of 20% to 40% through the steps of forming the stress compensation layer and the first conductivity-type nitride semiconductor layer on the stress compensation layer.

The substrate may be maintained at a temperature of 1000° C. or higher while forming the second conductivity-type nitride semiconductor layer on the active layer.

The nitrogen source gas may include hydrogen ($H_2$) and at least one of ammonia ($NH_3$) and nitrogen ($N_2$), and the metal source gas may include an organic metal source gas and a carrier gas.

The organic metal source gas may include at least one of tri-methyl aluminum (TMAl), trimethyl gallium (TMGa), triethyl gallium (TEGa), and trimethyl indium (TMIn), and the carrier gas may include at least one of argon, nitrogen, hydrogen, helium, neon, xenon and combinations thereof.

The nitrogen source gas may have a volume fraction of hydrogen in a range of 20% to 35%, and the substrate may be maintained at a temperature of 970° C. to 1035° C.

According to another aspect of the invention, a method of growing a Group-III nitride semiconductor includes maintaining a substrate containing silicon at a temperature of 950° C. to 1040° C., and growing the Group-III nitride semiconductor, while maintaining the substrate at the temperature, by providing concurrently with a metal source gas, to an interior of a reaction chamber having the substrate, nitrogen source gas including hydrogen provided at a flow rate of 20000 sccm to 70000 sccm.

The hydrogen may be provided at a flow rate of 20000 sccm to 70000 sccm to maintain a volume fraction of hydrogen in the nitrogen source gas in a range of 20% to 40%.

The method may further include forming a buffer layer on a surface of the substrate containing silicon, forming a stress compensation layer on the buffer layer, and forming a first conductivity-type nitride semiconductor layer on the stress compensation layer. The stress compensation layer and the first conductivity-type semiconductor layers may be formed while maintaining the substrate at the temperature of 950° C. to 1040° C. and while providing the nitrogen source gas in which hydrogen is provided at the flow rate of 20000 sccm to 70000 sccm.

The method may further include forming an active layer on the first conductivity-type nitride semiconductor layer, and forming a second conductivity-type nitride semiconductor layer on the active layer. The first conductivity-type nitride semiconductor layer, the active layer, and the second conductivity-type nitride semiconductor layer may form a light emitting structure on the stress compensation layer.

According to a further aspect of the disclosure, a method is provided for forming a nitride crystal on a substrate. The method includes forming, on a surface of a substrate containing silicon, a buffer layer including a nucleation layer and a lattice buffer layer; and forming the nitride crystal on the lattice buffer layer, the step of forming the nitride crystal comprising sequentially forming a first nitride semiconductor layer, an intermediate layer, and a second nitride semiconductor layer on the lattice buffer layer. The step of forming the nitride crystal may include providing a nitrogen source gas including hydrogen provided at a flow rate of 20000 sccm to 70000 sccm for at least a portion of the step of forming the nitride crystal.

The first nitride semiconductor layer may have a lattice constant greater than that of the lattice buffer layer on which it is formed, and the intermediate layer may have a lattice constant smaller than that of the first nitride semiconductor layer.

The step of forming the nitride crystal may include maintaining the substrate at a temperature of 950° C. to 1040° C. while providing the nitrogen source gas including hydrogen at the flow rate of 20000 sccm to 70000 sccm.

The method may further include forming a light emitting structure on the second nitride semiconductor layer by performing steps of forming a first conductivity-type nitride semiconductor layer on the second nitride semiconductor layer; forming an active layer on the first conductivity-type nitride semiconductor layer; and forming a second conductivity-type nitride semiconductor layer on the active layer. The nitrogen source gas including hydrogen provided at the flow rate of 20000 sccm to 70000 sccm may be provided through the steps of forming the nitride crystal and the first conductivity-type nitride semiconductor layer.

According to another aspect of the disclosure, method of forming a nitride crystal on a substrate includes maintaining a substrate containing silicon at a temperature of 950° C. to 1040° C. and, while maintaining the substrate at the temperature, forming on the substrate a nitride crystal having melt-back defects with an average size of 400 µm or less.

The nitride crystal may be formed to have no more than 1% of melt-back defects having a diameter of 400 µm or greater.

The nitride crystal may be formed on the substrate by concurrently providing, to an interior of a reaction chamber having the substrate, a metal source gas and a nitrogen source gas wherein the nitrogen source gas has a volume fraction of hydrogen in a range of 20% to 40%.

The nitrogen source gas may include hydrogen ($H_2$) and at least one of ammonia ($NH_3$) and nitrogen ($N_2$), and the metal source gas may include a group-III metal source gas and a carrier gas.

The nitride crystal may be formed on the substrate by concurrently providing, to an interior of a reaction chamber having the substrate, a metal source gas and a nitrogen source gas wherein the nitrogen source gas has a flow rate of 20000 sccm to 70000 sccm.

The nitrogen source gas may include hydrogen ($H_2$) and at least one of ammonia ($NH_3$) and nitrogen ($N_2$), and the metal source gas may include a carrier gas and at least one of a tri-methyl aluminum (TMAl), trimethyl gallium (TMGa), triethyl gallium (TEGa), and trimethyl indium (TMIn).

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
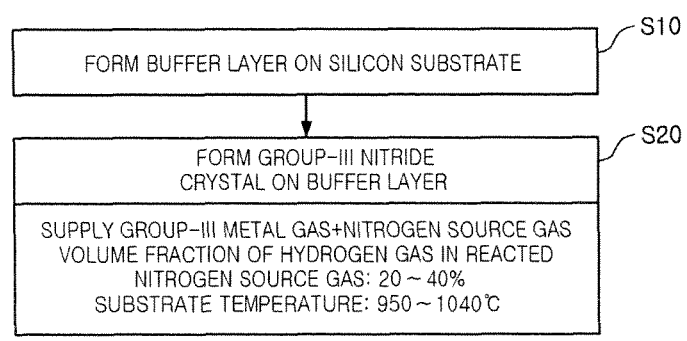
FIG. 1 is a flow chart illustrating a method of growing a nitride single crystal according to an exemplary embodiment of the inventive concept.

Hereinafter, exemplary embodiments of the present inventive concept will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Meanwhile, an expression "one example" used in the present disclosure does not refer to identical examples and is provided to stress different unique features between each of the examples. However, examples provided in the following description are not excluded from being associated or combined with features of another example and jointly implemented thereafter. For example, even if matters described in a specific example are not described in a different example, the matters may be combined as part of the descriptions of the other example, unless otherwise mentioned in the other example.

FIG. 1 is a flow chart illustrating a process of manufacturing a nitride crystal according to an exemplary embodiment of the present inventive concept.

Referring to FIG. 1, a manufacturing process according to the present exemplary embodiment may start with operation S10 to form a buffer layer on a silicon substrate.

The silicon substrate employed in the present exemplary embodiment may include a substrate partially formed of a silicon material, in addition to a substrate formed only of a silicon material. For example, a silicon-on-insulator (SOI) substrate may also be used. A (111) face of the silicon substrate may be used as a face for growing a crystal. The silicon substrate may be doped with a particular conductivity-type impurity such as a p-type impurity. For example, the p-type impurity may be at least one selected from the group consisting of B, Al, Mg, Ca, Zn, Cd, Hg, and Ga. In a specific example, the p-type impurity may be formed of boron (B).

A doping concentration of the p-type impurity may be set such that specific resistance of the silicon substrate is 1 Ωcm or less. For example, a doping concentration of the p-type impurity may range from approximately $5\times10^{17}/cm^3$ to approximately $1\times10^{20}/cm^3$, further, from $1\times10^{18}/cm^3$ to $5\times10^{19}/cm^3$.

The buffer layer may be used to reduce dislocation caused by lattice mismatch between the silicon substrate and a nitride single crystal to be formed during a follow-up process step, to reduce deformation caused by a difference between coefficients of thermal expansion, and to suppress generation of cracks. The buffer layer may be formed as a single layer or may have a multilayer structure including a plurality of layers. For example, the buffer layer may include an AlN nucleation layer and a lattice buffer layer formed of a nitride crystal containing aluminum (Al).

Subsequently, a Group-III nitride crystal may be formed on the buffer layer (S20).

During this process step, a Group-III metal source and a nitrogen source gas may be supplied to the interior of a reaction chamber and be reacted to grow a Group-III nitride crystal on a heated silicon substrate (i.e., the buffer layer) therein.

The Group-III metal source and the nitrogen source gas may be supplied to a reaction chamber through separate supply lines. The Group-III metal source may include an organic metal source gas (for example, TMGa, TMAl, TMIn) and a carrier gas (for example, $N_2$, $H_2$) carrying the organic metal source gas. The nitrogen source gas may include hydrogen ($H_2$) together with ammonia ($NH_3$) and nitrogen ($N_2$).

The hydrogen gas mixed with the nitrogen source gas may be used as a catalyst essential to grow a high quality nitride single crystal. During this process, a volume fraction of hydrogen in the nitrogen source gas may range from 20% to 40%. In general, a considerably large amount (greater than or equal to 50% by volume fraction) of hydrogen gas has been used as an essential catalyst, but the inventor of the present application newly proposes a scheme of maintaining a volume fraction of hydrogen in the nitrogen source gas at a level of approximately 40% or less, or further of 35% or less. A volume fraction of hydrogen may be mixed in the amount of at least 20% to act as an essential catalyst. Under these conditions, the Group-III nitride crystal layer can be grown at a commercially viable growth speed of between 2 microns/hour and 8 microns/hour. In contrast, a growth rate of the parts of the active region is extremely slow (e.g., far below 1 micron/hour) in situations in which a group III-nitride crystal is grown under nitrogen only (e.g., without hydrogen).

Figure 9:
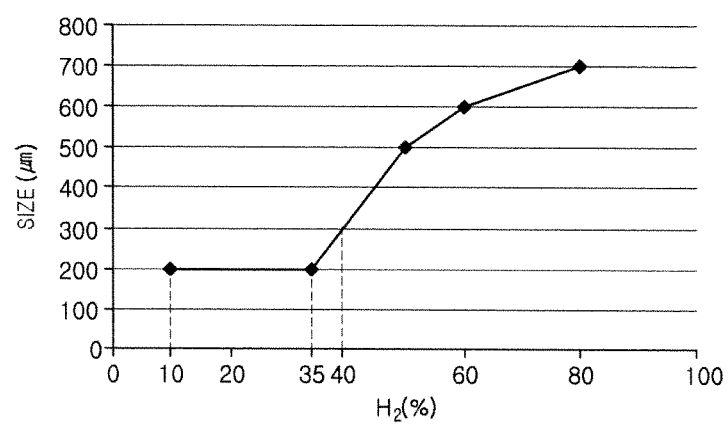
FIG. 9 is a graph illustrating variations in sizes of melt-back defects over volume fractions of hydrogen in a nitrogen source gas.
Figure 10:
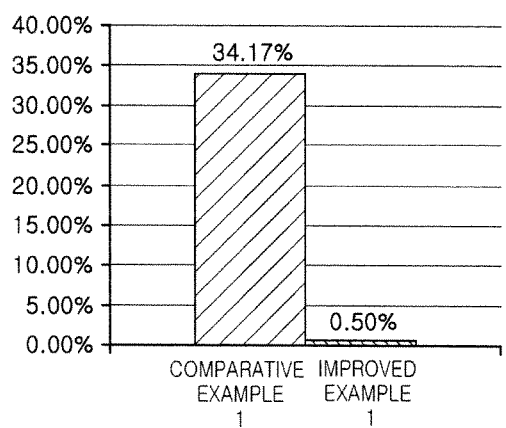
FIG. 10 is a graph illustrating percentages of melt-back defects in nitride single crystals obtained according to Improved Example 1 and Comparative Example 1 having a diameter greater than or equal to 400 µm.

The inventor has verified that a growth temperature of a nitride single crystal may be lowered by controlling hydrogen to have a small volume fraction, while maintaining high crystal quality (please refer to FIGS. 9 and 10). The volume fraction of hydrogen of the nitrogen source gas may be converted into a different unit such as a mole fraction, a mass fraction. Also, the volume fraction of hydrogen ($H_2$) may be expressed as a flow rate supplied to a chamber through a nitrogen source gas line. To obtain the foregoing effects, a flow rate of hydrogen may be expressed within the range from 20000 sccm (standard cubic centimeters per minute) to 70000 sccm.

By reducing a volume fraction of hydrogen in a nitrogen source gas, a nitride crystal having excellent crystal quality may be grown even at a temperature of about 1040° C., a relatively low growth temperature. Thus, by lowering the growth temperature, while guaranteeing nitride crystal quality in this manner, deformation caused by a difference in coefficients of thermal expansion between a substrate and the nitride single crystal may be suppressed or reduced. Also, through this scheme, variations in thickness of a thin film (in particular, a thickness of the active layer) caused due to occurrence of bowing (or an increase in curvature) that is aggravated in a wafer having a large diameter (for example, 8 inches or greater) may also be significantly reduced. Also, a melt-back phenomenon, a chronic problem faced by silicon substrates when a nitride crystal is grown, may be significantly alleviated. Meanwhile, a range of a growth temperature may be set to at least 950° C. to guarantee growth of an excellent nitride crystal.

In the present disclosure, a growth temperature refers to a temperature of a substrate, which is obtained by directly measuring the temperature of a substrate (or wafer) disposed within a reaction chamber. The growth temperature may be different from a temperature measured in any other region of the reaction chamber, in spite of the growth temperature actually corresponding to the temperature of the substrate. For example, even though a temperature of the substrate is controlled to be approximately 1040° C., a temperature of a susceptor (or a main disk) on which the substrate is disposed may be measured in particular equipment (for example, Axitron equipment) to have a temperature (for example, 1150° C.) higher than the actual temperature of the substrate. Thus, in measuring a growth temperature, the fact that temperatures may vary depending on deposition equipment or a measurement position may need to be taken into consideration.

The effect of adjusting a volume fraction of hydrogen in the nitrogen source gas may be described as follows. As proposed by the inventor of the present application, by limiting an amount of hydrogen gas supplied when a nitride crystal is grown, the probability of an undesired secondary reaction taking place between the hydrogen gas and a nitrogen radical that produces $NH_3$ may be reduced, thus sufficiently guaranteeing growth of excellent crystal without generating vacancies even with an amount of available nitrogen secured at a relatively low temperature. The limiting of the supply of hydrogen gas as newly proposed may be understood as bringing about an effect of lowering a growth temperature while maintaining a high quality crystal.

The nitrogen source gas may include nitrogen ($N_2$) together with ammonia ($NH_3$) directly used as a nitrogen source gas. For example, ammonia ($NH_3$) may have a volume fraction of approximately 65% or less in the entire nitrogen source gas, and the nitrogen gas may have a volume fraction of approximately 60% or less.

The scheme of limiting supply of a hydrogen gas proposed by the inventor of the present application may be applied to at least a portion or the entirety of the lattice buffer layer, part of the buffer layer, and the Group-III nitride crystal. In particular, the scheme may be applied to a GaN growth process to grow high quality crystals at a temperature of 1040° C. or lower.

Meanwhile, in a case in which a corresponding layer is inherently grown at a low temperature or in a case in which hydrogen is not provided in the nitrogen source gas, the scheme of limiting supply of a hydrogen gas may not be applied. For example, the AlN nucleation layer of the buffer layer is grown at a relatively low temperature, and thus, the scheme of limiting supply of a hydrogen gas may not be applied thereto. Also, when the lattice buffer layer is applied at a low growth temperature, the scheme of limiting supply of a hydrogen gas may not be applied. In this manner, even though the volume fraction condition (40% or less) of a hydrogen gas is not applied partially, a growth temperature in the corresponding stage may be controlled to be 1040° C. to suppress a melt-back phenomenon.

A process of growing a nitride single crystal according to the present exemplary embodiment will be described in detail with reference to FIG. 2.

Figure 2:
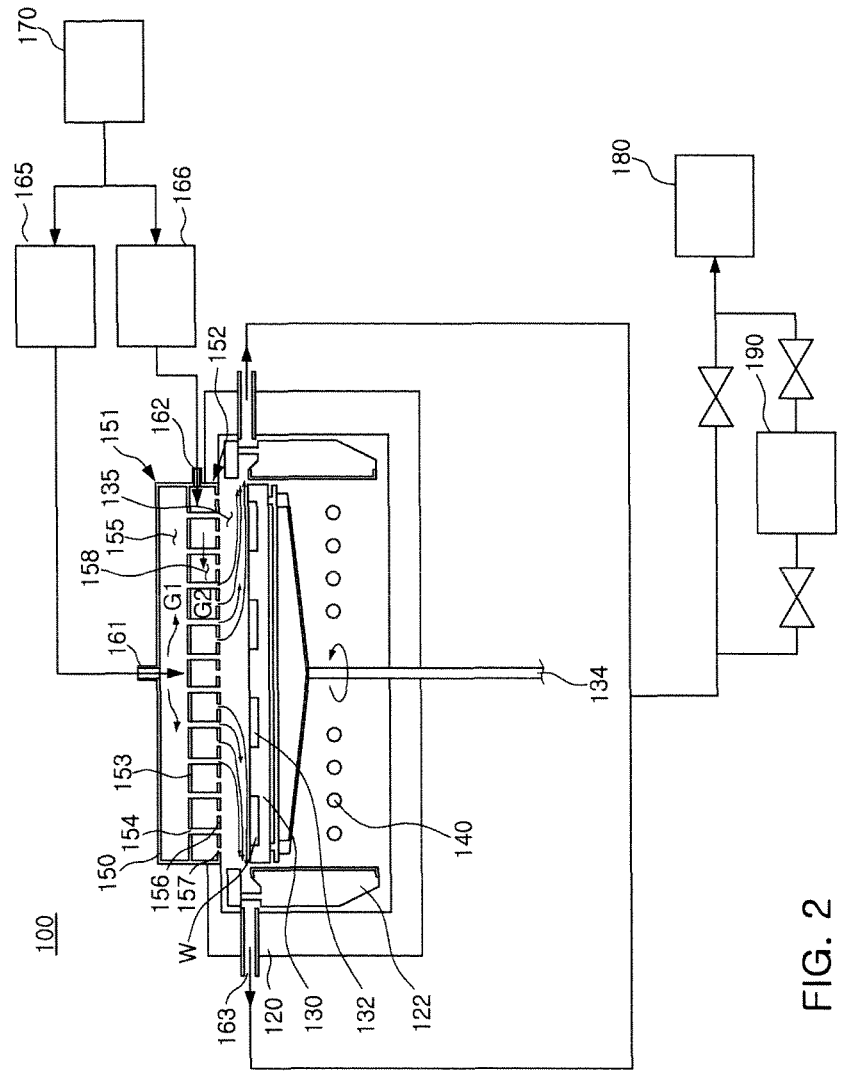
FIG. 2 is a view schematically illustrating an example of a thin film depositing apparatus that may be used in an exemplary embodiment of the inventive concept.

FIG. 2 is a view schematically illustrating a metal-organic chemical vapor deposition (MOCVD) apparatus as an example of a thin film depositing apparatus that may be used in an exemplary embodiment of the present inventive concept.

A chemical vapor depositing apparatus 100 illustrated in FIG. 2 may include a process chamber 120 having an internal space of a predetermined size, a susceptor 130 (also called a "disk") rotatably installed within the process chamber 120, heating units 140 disposed below the susceptor 130, and a chamber cover 150 positioned above the process chamber 120 to receive a source gas to be introduced to the process chamber 120.

The internal space of the process chamber 120 may have a hollow structure. The process chamber 120 may include a reaction space 135 provided therein to allow a source gas supplied to an upper side of the susceptor 130 to chemically be reacted. Here, a space between the chamber cover 150 and the susceptor 130 may be defined as the reaction space 135. For example, a height of the reaction space 135 may range from approximately 10 mm to 20 mm, but the present inventive concept is not limited thereto.

The process chamber 120 may be formed of a metal having excellent abrasion resistance, heat resistance, and corrosion resistance. For example, such a material may be stainless steel (SUS). The chamber cover 150 and the susceptor 135 may also be formed of a material identical or similar to that of the process chamber 120.

The susceptor 130 may be positioned at a central portion of the process chamber 120. A central axis of the internal space of the process chamber 120 may be substantially identical to an axis of a rotational shaft 134 of the susceptor 130. The susceptor 130 may have a pocket 132 having a disk shape, depressed to allow a wafer (W) such as a silicon substrate wafer serving as a deposition target to be placed therein. The susceptor 130 may have a plurality of pockets 132.

The heating units 140 may be provided below the susceptor 130 to provide radiant heat to the susceptor 130. Such radiant heat may heat the wafer W placed in the susceptor 130. The heating units 140, a type of heat transfer members generating heat when power is applied thereto, may be arranged in regions corresponding to the pockets 132. The heating units may be selected from among an electric heater, high frequency induction, infrared radiation, and a laser.

Each pocket 132 may have a convex bottom surface with a predetermined curvature. Even though the wafer W such as a silicon substrate is bowed during a growth process, the convex bottom surface of each pocket 132 may serve to relatively uniformly contact and maintain a space of the silicon substrates, thus effectively reducing temperature variations in the silicon wafers W based on positions thereof.

The chamber cover 150 may have a structure hermetically sealing the process chamber 120 to maintain air-tightness and capable of being opened and closed with respect to the process chamber 120. The chamber cover 150 may have a shower head-type jetting structure provided above the process chamber 120 to vertically jet a source gas toward the susceptor 130 rotating therebelow.

The shower head-type jetting structure may include a first source supply unit 151 and a second source supply unit 152.

The first source supply unit 151 may have a first storage chamber 155 accommodating a first source gas G1 introduced through a first inlet pipe 161. The second source supply unit 152 may have a second storage chamber 158 accommodating a second source gas G2 introduced through a second inlet pipe 162.

A first cover member 153 may be disposed between the first and second storage chambers 155 and 158. The first cover member 153 may have a plurality of first jetting pipes 154 jetting the first source gas G1 introduced to the first storage chamber 155. The first jetting pipes 154 may penetrate through the second storage chamber 158 and be configured to vertically jet the first source gas G1 toward the susceptor 130.

Also, a second cover member 156 may be disposed between the second storage chamber 158 and the susceptor 130. The second cover member 156 may have a plurality of second jetting pipes 157 jetting the second reactive gas G2 introduced to the second storage chamber 158. The second jetting pipes 157 may be configured to vertically jet the second source gas G2 toward the susceptor 130.

During a Group-III nitride semiconductor thin film depositing process, the first source gas G1 may be provided as a nitrogen source gas from a nitrogen source 165, and a supply line for the first source gas G1 is also called a "hydride line". The nitrogen source gas supplied through the line may be a mixture of $N_2$ and $H_2$ gases together with $NH_3$. The second source gas G2 may be provided from a Group-III metal and/or dopant source 166 as a metal source carried together with a carrier gas, and a supply line for the second source gas G2 is also called a "metal organic (MO) source line". The Group-III metal source supplied through the line may include at least one of a tri-methyl aluminum (TMAl), trimethyl gallium (TMGa), triethyl gallium (TEGa), and trimethyl indium (TMIn), and a dopant source as needed. The dopant source may be a magnesium gas ($Cp_2Mg$ or $(C_5H_5)_2Mg$) for a p-type dopant or a magnesium gas ($SiH_4$ or $Si_2H_6$) for an n-type dopant. A carrier gas carrying the Group-III metal or dopant source 166 may be at least one among argon, nitrogen, hydrogen, helium, neon, xenon and combinations thereof. Selection of a source required for the depositing process and adjustment of a supply flow rate may be adjusted by the source supply controller 170.

In the shower head-type jetting structure, the first source gas G1 may be introduced to the interior of the first storage chamber 155 through first gas inlet pipe 161, and the introduced first source gas G1 may flow to the reaction space 135 through the first jetting pipe 154. Also, the second source gas G2 may be introduced to the interior of the second storage chamber 158 through the second gas inlet pipe 162, and the introduced second reactive gas G2 may flow to the reaction space 135 through the second jetting pipe 157. Accordingly, the first and second source gases G1 and G2 may be chemically reacted in the reaction space 135 along the surface of the susceptor 130, and a thin film, a product of the reaction, may be deposited on a surface of the wafer W.

After the reaction, residual first and second source gases G1 and G2 may flow from the center of the process chamber 120 toward an outer circumference thereof and be discharged outwards through a gas outlet 163 provided on an outer circumference of the process chamber 120. This discharge process may be performed by using a discharge pump 180. In addition, a vacuum forming pump 190 may be provided to be connected to the gas outlet 163 in order to vacuumize the interior of the process chamber 130 when necessary (for example, before the deposition process).

The chamber cover 150 may have a sealing member such as an O-ring to maintain air-tightness when being combined to and closed against the process chamber 120. The first and second cover members 153 and 156 may have an overall circular shape corresponding to the shape of the chamber cover 150, and may be detachably attached to the chamber cover 150. The first and second cover members 153 and 156 may be formed of a material having excellent heat resistance. For example, the first and second cover members 153 and 156 may be formed of quartz or graphite coated with silicon carbide (SiC).

Figure 3:
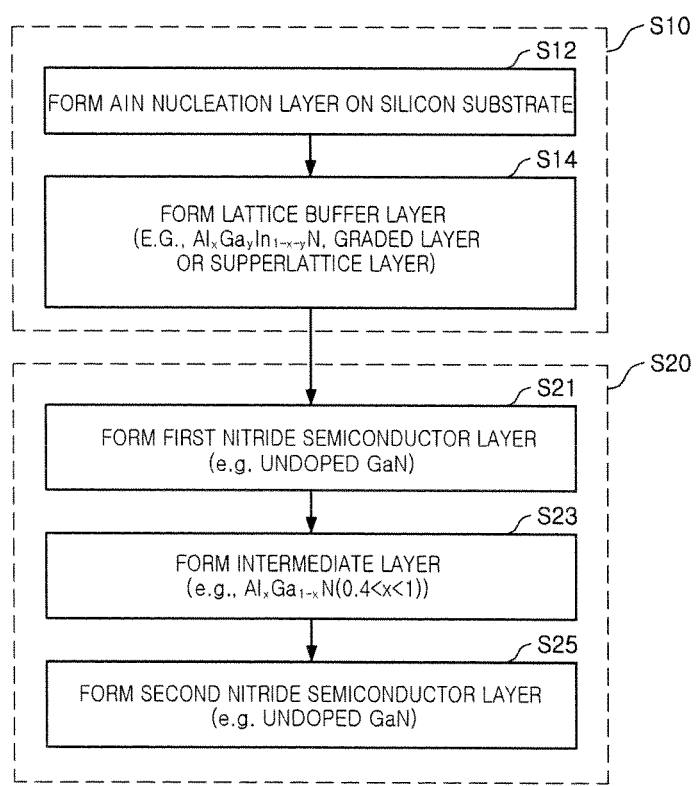
FIG. 3 is a flow chart illustrating a specific example of a method of growing the nitride single crystal illustrated in FIG. 1.

The method of manufacturing a nitride crystal according to various exemplary embodiments of the present inventive concept may be implemented by using the foregoing MOCVD apparatus. The growth process illustrated in FIG. 1, namely, the process of forming the buffer layer and the nitride crystal on the silicon substrate, may be performed in various forms. FIG. 3 is a flow chart illustrating a specific example of the process illustrated in FIG. 1.

As illustrated in FIG. 3, operation S10 of forming the buffer layer on the silicon substrate may include operation S12 of forming a nucleation layer and operation S14 of forming a lattice buffer layer on the nucleation layer.

The operation to form the buffer layer according to the present exemplary embodiment may start from operation S12 of forming a nucleation layer on the silicon substrate.

The nucleation layer may be formed on the (111) face of the silicon substrate. The nucleation layer may provide a growth surface having improved wettability. For example, the nucleation layer may be formed of AlN. The nucleation layer may prevent a melt-back phenomenon in which silicon of the substrate and gallium of the nitride single crystal react to form a eutectic metal. Formation of the AlN nucleation layer may start from a process of injecting an aluminum source such as trimethyl aluminum. The first injection of the Al source may prevent the silicon substrate from being first exposed to ammonia to be nitrificated. For example, the nucleation layer may have a size ranging from tens of nm to hundreds of nm.

In operation S14, the lattice buffer layer may be formed on the nucleation layer. The lattice buffer layer may have a dislocation loop formed in an interface with a nitride crystal to be grown later to reduce dislocation density. Also, the lattice buffer layer may alleviate lattice mismatch and thermal expansion coefficient mismatch with the nitride single crystal to be grown later to effectively generate compressive stress when a crystal is grown, and reduce tensile stress generated during cooling. The lattice buffer layer may be formed of a nitride crystal containing aluminum (Al) and may be a single layer or a plurality of layers. For example, the lattice buffer layer may be a graded $Al_xIn_yGa_{1-x-y}N$ ($0 \leq x, y \leq 1, x+y \leq 1$) or $Al_{x1}In_{y1}Ga_{1-x1-y1}N/Al_{x2}In_{y2}Ga_{1-x2-y2}N$ ($0 \leq x1, x2, y1, y2 \leq 1$, $x1 \neq x2$ or $y1 \neq y2$, $x1+y1 \leq 1, x2+y2 \leq 1$) superlattice layer in which the content of ingredients such as AlGaN or Al increases or decreases linearly or in a stepwise manner. In a specific example, the lattice buffer layer may have a structure in which AlGaN and AlN are alternately stacked. For example, the lattice buffer layer may be a triple-layer structure including AlGaN/AlN/AlGaN.

The lattice buffer layer may be grown within a temperature range from 700° C. to 1040° C. However, since the lattice buffer layer is adjacent to the silicon substrate, it may sensitively affect melt-back. In consideration of this, a growth temperature of the lattice buffer layer may be maintained to be lower. For example, the lattice buffer layer may be grown at a temperature of approximately 1010° C. or lower.

Various examples of the buffer layer as described above will be described in detail with reference to FIGS. 4 through 7.

Operation S20 of forming the nitride single crystal may include operations (S21, S23, and S25) of sequentially forming a first nitride semiconductor layer, an intermediate layer, and a second nitride semiconductor layer on the lattice buffer layer.

Operation S20 of forming the nitride single crystal may start with operation S21 of forming the first nitride semiconductor layer on the lattice buffer layer.

The first nitride semiconductor layer may be a nitride crystal having a lattice constant greater than that of the lattice buffer layer. The first nitride semiconductor layer may include $Al_xIn_yGa_{1-x-y}N$ ($0 \leq x, y \leq 1$, $x+y<1$). For example, the first nitride semiconductor layer may be GaN.

The first nitride semiconductor layer may receive compressive stress at an interface thereof with the lattice buffer layer. After the growing process, when the first nitride semiconductor layer is cooled at room temperature, tensile stress may be generated due to a difference between coefficients of thermal expansion of the substrate and the first nitride semiconductor layer. In order to compensate for the stress, an intermediate layer may be formed on the first nitride semiconductor layer in operation S23. The intermediate layer may be a nitride crystal having a lattice constant smaller than that of the first nitride semiconductor layer. For example, the intermediate layer may be $Al_xGa_{1-x}N$ ($0.4<x<1$).

Subsequently, a second nitride semiconductor layer may be formed on the intermediate layer in operation S25. The second nitride semiconductor layer may have high compressive stress. By compensating for relatively weak compressive stress or tensile stress applied to the first nitride semiconductor layer with compressive stress of the second nitride semiconductor layer, cracks may be reduced. The second nitride semiconductor layer may include $Al_xIn_yGa_{1-x-y}N$ ($0 \leq x, y \leq 1$, $x+y<1$), similar to the first nitride semiconductor layer. For example, the second nitride semiconductor layer may be GaN. GaN used as the first and second nitride semiconductor layers may be undoped GaN.

In a specific embodiment, a nitride laminate having at least one nitride semiconductor layer may be additionally formed on the second nitride semiconductor layer. Such a nitride semiconductor layer may be formed of $Al_xIn_yGa_{1-x-y}N$ ($0 \leq x, y \leq 1$, $x+y \leq 1$), and may be an undoped layer or may be doped with an n-type and/or p-type impurity. For example, the nitride semiconductor layer may be a plurality of layers provided as an element for performing a particular function.

The nitrogen source gas used in the aforementioned depositing operation may include hydrogen ($H_2$) together with $NH_3$ and $N_2$. A volume fraction of the hydrogen gas in the nitrogen source gas may be approximately 40% or less.

A nitride growth process based on controlling hydrogen to have a low volume fraction may be generally applied to the entirety of the nitride crystal forming operation S20, or may be applied only to a partial process.

Alternatively, the nitride crystal growth based on the low volume fraction of hydrogen may also be advantageously applied to a process of a different operation to grow a high temperature nitride crystal to obtain a high quality crystal, aside from the nitride crystal forming operation S20. For example, the nitride crystal growth based on the low volume fraction of hydrogen may also be applied to operation S14 to form the lattice buffer layer during the buffer layer forming operation S10 and/or the operation to form the at least one nitride semiconductor layer on the second nitride semiconductor layer.

In this manner, by controlling hydrogen to have a low volume fraction, a growth temperature in each process can be lowered to have a predetermined range (for example, lowered by approximately 20° C. to 30° C. below a regular growth temperature of 1050° C. to 1080° C.), while maintaining excellent crystal quality. For example, high quality nitride crystal can be obtained even under a condition in which a nitride crystal growth temperature is approximately 1040° C.

A reduction in the growth temperature obtained by controlling hydrogen to have a low volume fraction in the hydrogen source gas may considerably reduce deformation caused by a difference between coefficients of thermal expansion and effectively improve variations in a thin film thickness caused by bowing generated due to the growth process. In particular, a remarkable effect of significantly reducing occurrence of a melt-back defect may be anticipated.

FIGS. 4 through 7 are cross-sectional views illustrating various examples of structures of a buffer layer and a stress compensation layer employable in an exemplary embodiment of the present inventive concept.

Figure 4:
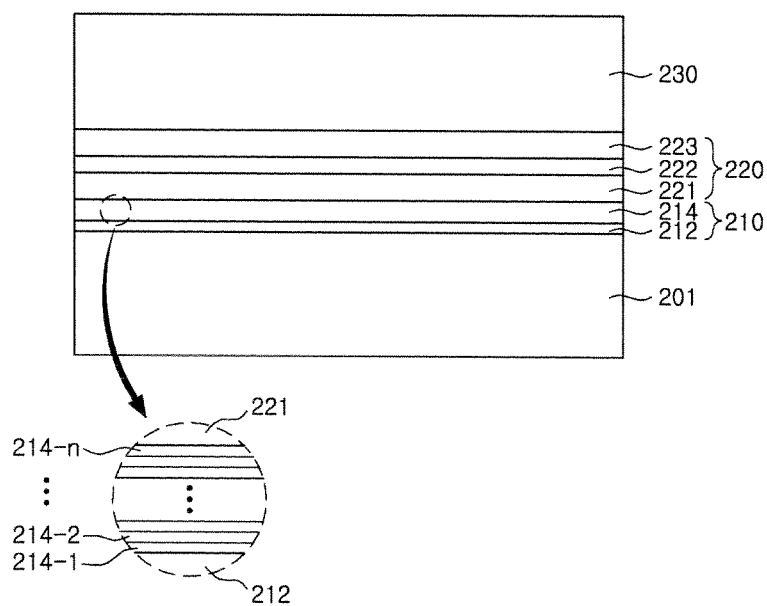
FIGS. 4 through 7 are cross-sectional views respectively illustrating various examples of structures of a buffer layer and a stress compensation layer employable in an exemplary embodiment of the present inventive concept.

As illustrated in FIG. 4, a buffer layer 210, a stress compensation layer 220, and a nitride laminate 230 may be sequentially disposed on a silicon substrate 201.

The silicon substrate 201 may include a substrate partially formed of a silicon material, as well as a substrate formed only of a silicon material. For example, a silicon-on-insulator (SOI) substrate may also be used. An upper surface of the silicon substrate 201 may be a (111) face.

The buffer layer 210 may include a nucleation layer 212 disposed on the silicon substrate 201 and a lattice buffer layer 214 disposed on the nucleation layer 212.

The nucleation layer 212 may be AlN. The nucleation layer 212 may be provided to prevent a melt-back phenomenon. Also, the nucleation layer 212 may provide a growth surface having enhanced wettability advantageous for crystal growth. For example, the nucleation layer 212 may have a size ranging from tens of nm to hundreds of nm.

The lattice buffer layer 214 may bend a threading dislocation to reduce defects. As the lattice buffer layer 214 has a greater thickness, compressive stress relaxation in a first nitride semiconductor layer 221 to be grown later may be reduced and defects may be decreased. The lattice buffer layer 214 may have a thickness ranging from hundreds of nm to a few nm.

The lattice buffer layer 214 may have a single composition, or may be a graded layer formed of $Al_xIn_yGa_{1-x-y}N$ ($0 \leq x, y \leq 1, x+y \leq 1$) as illustrated in FIG. 4. The graded structure employed in the present exemplary embodiment may include a plurality of layers 214-1, 214-2, . . . , 214-n, and the plurality of layers 214-1, 214-2, . . . , 214-n may have a step-graded structure in which an Al composition is sequentially reduced. In a specific example, the lattice buffer layer 214 having the graded structure may be implemented with ternary-based AlGaN in which the Al composition is adjusted. In another example, the lattice buffer layer 214 may have a linearly-graded structure rather than a step-graded structure.

The lattice buffer layer 214 may reduce lattice mismatch between the AlN nucleation layer 212 and the first nitride semiconductor layer 221 in stages. In particular, the lattice buffer layer 214 may effectively generate compressive stress during crystal growth, reducing tensile stress generated during cooling.

The stress compensation layer 220 may include the first nitride semiconductor layer 221, an intermediate layer 222, and a second nitride semiconductor layer 223 sequentially disposed on the lattice buffer layer 214.

The first nitride semiconductor layer 221 may be a nitride crystal having a lattice constant greater than that of the lattice buffer layer 214. The first nitride semiconductor layer 221 may include $Al_xIn_yGa_{1-x-y}N$ (0≤x, y≤1, x+y<1), and may be formed of, for example, GaN. The first nitride semiconductor layer 221 may receive compressive stress at an interface thereof with the lattice buffer layer 214.

Such compressive stress may be alleviated as the first nitride semiconductor layer 221 has a greater thickness. However, if the thickness of the first nitride semiconductor layer 221 is increased (to be greater than or equal to approximately 2 μm), when the first nitride semiconductor layer is cooled at room temperature after being completely grown, it is difficult to control tensile stress generated due to a difference between coefficients of thermal expansion of the substrate 201 and the first nitride semiconductor layer 221, and cracks may further occur.

The intermediate layer 222 may be disposed on the first nitride semiconductor layer 221 to compensate for tensile stress generated during the cooling operation. The intermediate layer 222 may be a nitride crystal having a lattice constant smaller than that of the first nitride semiconductor layer 221. For example, the intermediate layer 222 may be formed of $Al_xGa_{1-x}N$ (0.4<x<1).

The second nitride semiconductor layer 223 may be disposed on the intermediate layer 222. The second nitride semiconductor layer 223 may have compressive stress. The compressive stress of the second nitride semiconductor layer 223 may compensate for relatively weak compressive stress or tensile stress applied to the first nitride semiconductor layer 221, suppressing occurrence of cracks. The second nitride semiconductor layer 223 may include $Al_xIn_yGa_{1-x-y}N$ (0≤x,y≤1, x+y<1), similar to the first nitride semiconductor layer 221. For example, the second nitride semiconductor layer 223 may be formed of GaN. At least one of the first and second nitride semiconductor layers 221 and 223 may be an undoped nitride layer, but the present inventive concept is not limited thereto.

The nitride laminate 230 may be additionally disposed on the second nitride semiconductor layer 223. The nitride laminate 230 may include at least one nitride semiconductor layer formed of $Al_xIn_yGa_{1-x-y}N$ (0≤x,y≤1, x+y≤1). The at least one nitride semiconductor layer may be an undoped layer or a nitride layer doped with an n-type or p-type impurity. For example, the nitride laminate 230 may be a plurality of nitride semiconductor layers for a device (for example, a semiconductor light emitting device) for performing a particular function.

Also, in the present exemplary embodiment, the scheme of limiting supply of a hydrogen gas as described above may be employed in all nitride crystal growth processes in which high temperature growth is required. For example, the scheme of limiting supply of a hydrogen gas may be applied to all of the process of growing the stress compensation layer having the first nitride semiconductor layer 221, the intermediate layer 222, and the second nitride semiconductor layer 223, together with the process of growing the lattice buffer layer 214 or may be selectively applied only to at least a partial stage of the growth process as needed. For example, the scheme of limiting supply of a hydrogen gas may be advantageously employed in the single crystal growth process that requires a high temperature growth process. Also, the scheme of limiting supply of a hydrogen gas may be applied to a partial process of the growth process of the nitride laminate 230.

Figure 5:
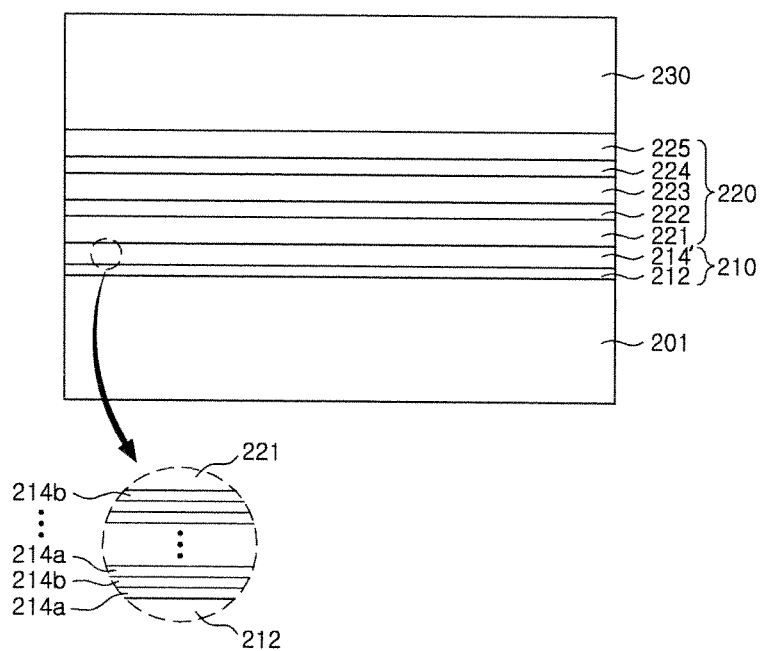

Referring to FIG. 5, a buffer layer 210, a stress compensation layer 220, and a nitride laminate 230 are sequentially disposed on a silicon substrate 201, similar to those of FIG. 4.

Compared to FIG. 4, components in FIG. 5 that are denoted by the same reference numerals are identical or similar to those illustrated in FIG. 4 and the matters described above with reference to FIG. 4 may be combined with descriptions of the present exemplary embodiment, unless otherwise mentioned.

Similar to the buffer layer 210 illustrated in FIG. 4, the buffer layer 210 in FIG. 5 may include an AlN nucleation layer 212 and a lattice buffer layer 214', and the lattice buffer layer 214' employed in the present exemplary embodiment may have a structure different from that of the lattice buffer layer 214 illustrated in FIG. 4.

The lattice buffer layer 214' may have a superlattice structure in which two or more layers 214a and 214b having different compositions are alternately stacked. For example, the lattice buffer layer 214' may be an $Al_{x1}In_{y1}Ga_{1-x1-y1}N/Al_{x2}In_{y2}Ga_{1-x2-y2}N$ (0≤x1,x2,y1,y2≤1, x1≠x2 or y1≠y2, x1+y1≤1, x2+y2≤1) superlattice layer. The lattice buffer layer 214' having the superlattice structure as in the present exemplary embodiment may also effectively mitigate stress between the silicon substrate 201 and the first nitride semiconductor layer 221.

The stress compensation layer 220 employed in the present exemplary embodiment may further include a second intermediate layer 224 and a third nitride semiconductor layer 225, in addition to the first and second nitride semiconductor layers 221 and 223 described above with reference to FIG. 4 and the first intermediate layer 222 disposed therebetween.

The second intermediate layer 224 and the third nitride semiconductor layer 225 may be understood as layers performing a function similar to that of the first intermediate layer 222 and the second nitride semiconductor layer 223. Namely, the second intermediate layer 224 may be disposed on the second nitride semiconductor layer 223 in order to compensate for tensile stress generated during cooling. The second intermediate layer 224 may be a nitride crystal having a lattice constant smaller than that of the second nitride semiconductor layer 224. For example, the second intermediate layer 224 may be formed of $Al_xGa_{1-x}N$ (0.4<x<1), similar to the first intermediate layer 222.

The third nitride semiconductor layer 225 may be disposed on the second intermediate layer 224. The third nitride semiconductor layer 225 may have compressive stress, and such compressive stress of the third nitride semiconductor layer 225 may compensate for relatively weak compressive stress or tensile stress applied to the first and second nitride semiconductor layers 221 and 223 (in particular, second nitride semiconductor layer 223) positioned therebelow, suppressing occurrence of cracks.

The third nitride semiconductor layer 225 may include $Al_xIn_yGa_{1-x-y}N$ (0≤x,y≤1, x+y<1), similar to the second nitride semiconductor layer 223. For example, the third nitride semiconductor layer 225 may be formed of GaN.

Figure 6:
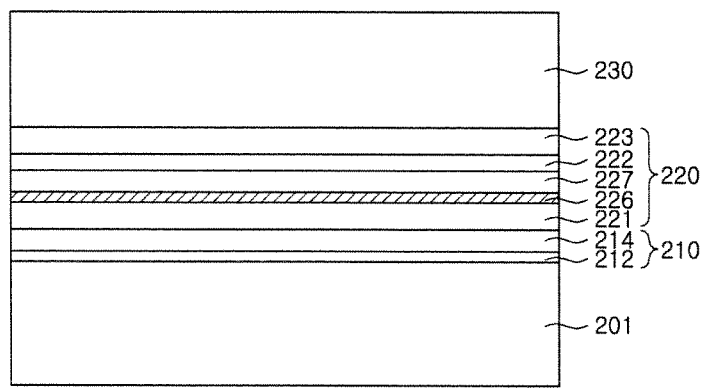

Referring to FIG. 6, a buffer layer 210, a stress compensation layer 220, and a nitride laminate 230 are sequentially disposed on a silicon substrate 201, similar to FIG. 4. However, unlike the example illustrated in FIG. 4, the stress compensation layer 220 illustrated in FIG. 6 includes a mask layer 226 and a coalesced nitride layer 227 formed on the mask layer 226.

The mask layer 226 may be disposed on the first nitride semiconductor layer 221.

Most threading dislocation from the first nitride semiconductor layer 221 may be blocked by the mask layer 226, and residual partial threading dislocation may also be bent by the coalesced nitride layer 227 to be grown later. As a result, defect density of a nitride crystal to be grown later may be significantly improved. A thickness and defect density of the coalesced nitride layer 227 may vary depending on growth conditions, for example, variables such as temperature, pressure, and/or a mole ratio of a V/III source.

The mask layer 226 may be formed of silicon nitride ($SiN_x$) or titanium nitride (TiN). For example, the $SiN_x$ mask layer 226 may be formed by using silane ($SiH_4$) and ammonia gas. The mask layer 226 may not completely cover the surface of the first nitride semiconductor layer 221. Thus, an exposed region of the first nitride semiconductor layer 221 may be determined according to a degree by which the mask layer 226 covers the first nitride semiconductor layer 221, and an initial island growth form of a nitride crystal grown thereon may vary. For example, in a case in which an exposed area of the nitride semiconductor layer is reduced by increasing the $SiN_x$ mask region, density of initial islands of the nitride layer 227 to be grown on the mask layer 226 may be reduced, while a size of coalesced islands may be relatively increased. Thus, a thickness of the coalesced nitride layer 227 may also be increased.

In the case in which the mask layer 226 is added, stress between the nitride semiconductor layers may be decoupled by the mask layer 226, partially blocking compressive stress transmitted to the coalesced nitride layer 227. Also, in case of the coalesced nitride layer 227, relative tensile stress may be generated while the grown islands are coalesced. As a result, the first nitride semiconductor layer 221 may receive strong compressive stress by the buffer layer 210, while the coalesced nitride layer 227 on the mask layer 226 may receive relatively weak compressive stress or tensile stress due to stress decoupling and island coalescence. When a thickness of the layer having relatively small compressive stress exceeds a critical point, cracks may occur in the thin film when cooled, and thus, the thickness of the coalesced nitride layer 227 may be selected to conform to conditions in which defect density is reduced, while cracks do not occur.

Figure 7:
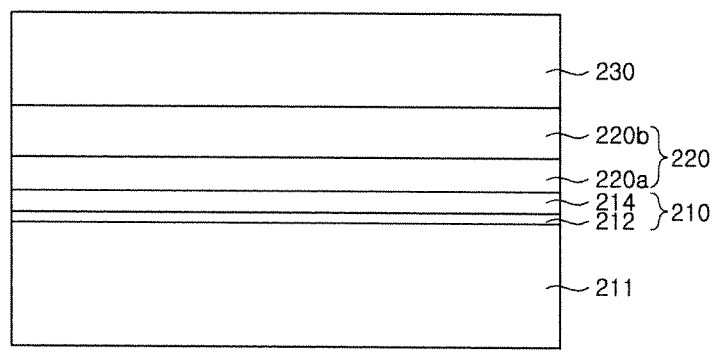

Referring to FIG. 7, the buffer layer 210, the stress compensation layer 220, and the nitride laminate 230 are sequentially disposed on the silicon substrate 201.

The stress compensation layer 220 employed in the present exemplary embodiment may include first and second nitride semiconductor layers 220a and 220b formed under different growth conditions. The first nitride semiconductor layer 220a may be grown in a two-dimensional (2D) mode such that a rate of increase in surface roughness of the nitride semiconductor layer 220a is controlled, to thus reduce generation of a twist grain boundary in an interface between the first nitride semiconductor layer 220a and the second nitride semiconductor layer 220b.

The first nitride semiconductor layer 220a may be formed under a first growth condition in which a ratio of surface roughness thereof to surface roughness of the buffer layer 210 is 3 or less, and the second nitride semiconductor layer 220b may be formed on the first nitride semiconductor layer 220a under a second growth condition. Here, at least one of a temperature, pressure, and a V/III mole ratio of the second growth condition may be different from those of the first growth condition such that a 3D growth mode may be increased, relative to the first growth condition.

As for temperature, a growth temperature of the first nitride semiconductor layer 220a may be set to be lower than that of the second nitride semiconductor layer 220b. For example, the first nitride semiconductor layer 220a may be grown at a temperature ranging from 950° C. to 1040° C., and further, ranging from 970° C. to 1035° C. Under the growth temperature condition, the first nitride semiconductor layer 220a may have high crystallinity and generation of a twist grain boundary may be effectively reduced.

The second nitride semiconductor layer 220b may be grown under the second growth condition different from the first growth condition such that the 3D growth mode is strengthened. For example, a temperature range of the second growth condition may be set to be higher than a growth temperature of the second nitride semiconductor layer 220b. As described above, the second nitride semiconductor layer 220b may be grown at a temperature of 1040° C. or lower by controlling a volume fraction of hydrogen in the nitrogen source gas to be 40% or less. The first nitride semiconductor layer 220a may also be grown at a temperature lower than 1040° C. by controlling a volume fraction of hydrogen under a similar condition.

The first growth condition of the first nitride semiconductor layer 220a may also be set by adjusting pressure of a Group V/III source mole ratio. In general, as pressure is lowered, crystallinity and compressive stress may be increased, and as the V/III ratio is increased, crystallinity and compressive stress may be increased. For example, a pressure range of the first growth condition may be 20 torr to 500 torr. A pressure range of the second growth condition may be 50 torr to 300 torr.

The first nitride semiconductor layer 220a may have a thickness ranging from 2 nm to 1000 nm. An increase in the thickness of the first nitride semiconductor layer 220a may reduce generation of a twist grain boundary in the interface between the first nitride semiconductor layer 220a and the second nitride semiconductor layer 220b. However, the increase in the first nitride semiconductor layer 220a may degrade crystallinity of the entire thin film. This is because, since the first nitride semiconductor layer 220a is grown at a temperature lower than that of the nitride layer, a defect may be rather increased. Thus, it is preferred that the thickness of the first nitride semiconductor layer 220a be reduced, while reducing generation of a twist grain boundary.

The reduction in the twist grain boundary may lead to a reduction in a defect of the second nitride semiconductor layer 220b stacked on the first nitride semiconductor layer 220a. Namely, since the first nitride semiconductor layer 220a has a thickness ranging from 2 nm to 1000 nm and roughness of 3 or less as a ratio thereof to roughness of the buffer layer, a defect of the second nitride semiconductor layer 220b stacked thereon may be reduced. Thus, since equal crystallinity is obtained with a smaller thickness, the entire structure may be reduced in thickness, and for example, an overall thickness of the buffer layer 210 and the stress compensation layer 220 may be obtained as 6 μm or less even without using a mask layer. Thus, a process time during the crystal growth process and cost may be reduced.

The second nitride semiconductor layer 220b may be formed of $Al_xIn_yGa_{1-x-y}N$ (0≤x,y≤1, x+y<1). The second nitride semiconductor layer 220b may be continuously and directly grown on the first nitride semiconductor layer 220a without additionally growing a layer having a different composition therebetween. The second nitride semiconductor layer 220b may have a composition identical to that of the first nitride semiconductor layer 220a. For example, the first and second nitride semiconductor layers 220a and 220b may be GaN. In a specific example, the first nitride semiconductor layer 220a may be undoped GaN and the second nitride semiconductor layer 220b may be n-type GaN.

Also, in the foregoing exemplary embodiment, the scheme of limitedly supplying hydrogen gas as described above may be employed in all nitride crystal growth processes in which high temperature growth is required. In this manner, by lowering a volume fraction of hydrogen in the nitrogen source gas, a nitride crystal having excellent crystal quality may be grown even at a relatively low growth temperature. As a result, deformation caused by a difference between coefficients of thermal expansion of the substrate and the nitride single crystal may be suppressed, and variations in a thickness of the thin film caused by generation of bowing (or increase in curvature) may be considerably reduced.

In particular, a melt-back phenomenon, one of the chronic problems faced by silicon substrates when nitride crystals are grown thereon, may be significantly alleviated.

Hereinafter, various effects of the present inventive concept will be described in detail with reference to specific exemplary embodiments.

Experiment 1: Growth of Nitride Crystal

A buffer layer, a stress compensation layer, and an n-type nitride semiconductor layer were formed on a (111) face of a silicon substrate by using MOCVD equipment.

First, an AlN nucleation layer (approximately 100 nm) was formed on the (111) face of the silicon substrate and an $Al_{0.3}Ga_{0.7}N$ (approximately 410 nm)/AlN (approximately 40 nm)/$Al_{0.3}Ga_{0.7}N$ (approximately 410 nm) was formed as a lattice buffer layer on the AlN nucleation layer. Subsequently, an undoped GaN layer (approximately 0.6 μm)/$Al_{0.5}Ga_{0.5}N$ intermediate layer (approximately 100 nm)/undoped GaN layer (approximately 0.6 μm) were formed as a stress compensation layer. Subsequently, an n-type GaN layer having a thickness equal to approximately 3.5 μm was additionally formed.

In this experiment, a nitride laminate was formed on the silicon substrate by using an MOCVD process under the same conditions. A mixture gas of $NH_3+N_2+H_2$ was used as a nitrogen source gas; however, volume fractions of hydrogen gas were varied to be 35% (Improved Example 1), 50% (Comparative Example 1), 60%, and 80%, respectively. Also, in Improved Example 1, nitride was grown at a temperature of approximately 1,030° C., 20° C. lower than a growth temperature (approximately 1,050° C.) of Comparative Example 1.

Figure 8A:
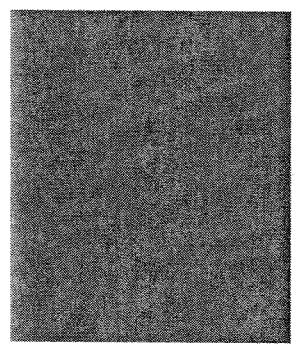
FIGS. 8A and 8B are atomic force microscope (AFM) photographs obtained by imaging surfaces of nitride single crystals obtained according to Improved Example 1 and Comparative Example 1
Figure 8B:
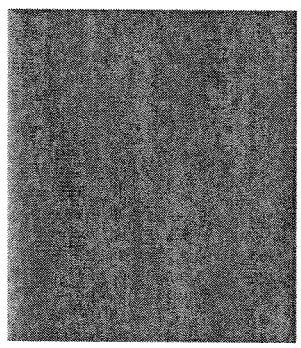

First, a surface of an n-type nitride semiconductor layer obtained in Improved Example 1 and a surface of an n-type nitride semiconductor layer obtained in Comparative Example 1 were imaged through an atomic force microscope (ATM). As a result, as illustrated in FIGS. 8A and 8B, the surface of the nitride semiconductor layer obtained in Improved Example 1 is similar to that of Comparative Example 1. Namely, in Improved Example 1, the volume fraction of hydrogen was lowered and the growth temperature was also lowered to approximately 1,030° C., 20° C. lower than that of Comparative Example 1, but it was confirmed that Improved Example 1 retained excellent crystallinity in spite of the relatively low growth temperature. In general, in case of a low growth temperature, nitrogen available for nitride crystal growth may not be sufficiently secured, increasing a crystal defect resulting from nitrogen vacancies on the surface of the nitride crystal, thereby significantly degrading crystal quality. However, in Improved Example 1, although the nitride crystal is grown at a relatively low temperature, a supply amount of hydrogen gas is limited to reduce an undesired reaction between hydrogen and available nitrogen, thus sufficiently securing substantially available nitrogen, whereby excellent crystal quality may be secured.

Next, melt-back defects generated within each of the nitride laminates obtained in the experiment were analyzed. FIG. 9 is a graph illustrating variations in average sizes of melt-back defects as a function of volume fractions of hydrogen.

As illustrated in FIG. 9, it was confirmed that an average size of melt-back defects, namely, defects formed of silicon-gallium eutectic metal, were approximately 400 μm, approximately 500 μm, and approximately 600 μm, respectively, which are considerably high, when volume fractions of hydrogen were 50%, 60%, and 80%, while the size of melt-back defects was considerably reduced to a level of approximately 200 μm when the volume fraction of hydrogen was controlled to be approximately 35% and approximately 10%. This is because the generation of the melt-back defects is affected by a growth temperature.

Regarding Improved Example 1 and Comparative Example 1, percentages of melt-back defects having a diameter of 400 μm or greater, among the entire melt-back defects, were calculated and shown in the graph of FIG. 10.

As illustrated in the graph of FIG. 10, in case of Comparative Example 1, very large melt-back defects represented a large proportion of defects at 34.17% of defects, but in case of Improved Example 1, very large melt-back defects were rarely detected with only 0.5% of defects being very large. In this manner, occurrence of melt-back defects may be significantly reduced by lowering the growth temperature and by lowering the volume fraction of hydrogen gas in the nitrogen source gas.

Since the growth temperature may be lowered while maintaining high quality crystal as well as reducing a melt-back effect, the generation of bowing (increase in curvature) and unevenness of a thin film thickness caused by deformation may be improved. This will be described in detail hereinbelow.

The method of manufacturing a nitride crystal may be commonly used to manufacture a nitride semiconductor device by using a silicon substrate. In particular, in the process of manufacturing a nitride semiconductor device according to the exemplary embodiment of the present inventive concept, since the growth temperature is lowered while maintaining a high quality crystal, the occurrence of defects (occurrence of cracks, uneven thin film thickness) caused by deformation may be reduced, and further, a wafer having a large diameter (for example, 8-inch wafer) may be used.

Figure 11:
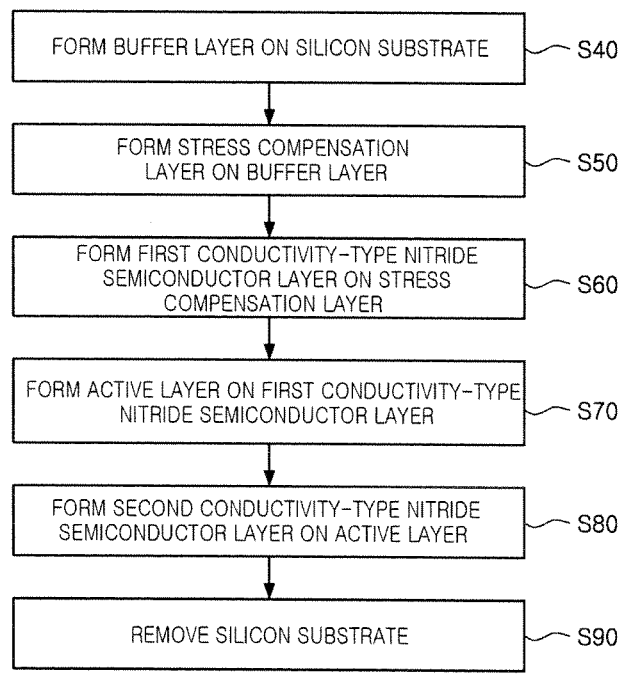
FIG. 11 is a flow chart illustrating a method of manufacturing a nitride semiconductor light emitting device according to an exemplary embodiment of the present inventive concept.

FIG. 11 is a flow chart illustrating a method of growing a nitride single crystal according to an exemplary embodiment of the present inventive concept.

A buffer layer may be formed on a silicon substrate in operation S40.

The buffer layer may be formed on a (111) face of the silicon substrate. The buffer layer may be configured as one or more layers. For example, the buffer layer may include an AlN nucleation layer and a lattice buffer layer formed of a nitride crystal containing aluminum (Al). The lattice buffer layer may be a monolayer or a plurality of layers. For example, the lattice buffer layer may be a graded $Al_xIn_y$ $Ga_{1-x-y}N$ (0≤x,y≤1,x+y≤1) or $Al_{x1}In_{y1}Ga_{1-x1-y1}N$/ $Al_{x2}In_{y2}Ga_{1-x2-y2}N$ (0≤x1,x2,y1,y2≤1, x1≠x2 or y1≠y2, x1+y1≤1,x2+y2≤1) superlattice layer in which the content of ingredients such as AlGaN or Al increases or decreases linearly or in a stepwise manner through the thickness of the layer. In a specific example, the lattice buffer layer may have a structure in which AlGaN and AlN are alternately stacked. For example, the lattice buffer layer may be a triple-layer structure including AlGaN/AlN/AlGaN. During this process, when the lattice buffer layer is grown at a high temperature, a volume fraction of hydrogen in the nitrogen source gas may be maintained to be approximately 40% or less (e.g., 35% or less) and the growth temperature may be lowered (e.g., to approximately 1,040° C. or lower) within a range in which a high quality crystal is maintained, in order to effectively suppress generation of a melt-back defect.

Subsequently, a stress compensation layer may be formed on the buffer layer in operation S50.

The stress compensation layer may be a layer for controlling tensile stress during cooling by adjusting compressive stress generated during the growth process. For example, the stress compensation layer may be disposed on the buffer layer and include a first nitride semiconductor layer having a lattice constant greater than that of the buffer layer, an intermediate layer disposed on the first nitride semiconductor layer and having a lattice constant smaller than that of the first nitride semiconductor layer, and a second nitride semiconductor layer having a lattice constant greater than that of the intermediate layer. The stress compensation layer may be implemented to have various structures. For example, various stacking structures described above with reference to FIGS. 4 through 7 may be advantageously employed.

During this process, a volume fraction of hydrogen in the nitrogen source gas may also be maintained at a level of approximately 40% or less (e.g., 35% or less) to allow a high quality crystal to be grown at a relatively low temperature (e.g., approximately 1,040° C. or lower). Thus, a melt-back phenomenon may be reduced and generation of compressive stress due to thermal expansion may be suppressed during growth, thus considerably alleviating a degree of wafer bowing.

Thereafter, a first conductivity-type nitride semiconductor layer may be formed on the stress compensation layer in operation 860, and an active layer may be formed on the first conductivity-type nitride semiconductor layer in operation S70.

The first conductivity-type nitride semiconductor layer may be a nitride semiconductor satisfying n-type $Al_xIn_y$ $Ga_{1-x-y}N$ (0≤x<1, 0≤y<1, 0≤x+y<1), and here, an n-type impurity may be silicon (Si). For example, the first conductivity-type nitride semiconductor layer may be n-type GaN. The active layer may have a multi quantum well (MQW) structure in which quantum well layers and quantum barrier layers are alternately stacked. For example, in case of a nitride semiconductor, a GaN/InGaN structure may be used. The active layer may have a single quantum well (SQW) structure.

In particular, during the growth process in operation S60, a volume fraction of hydrogen in the nitrogen source gas may be reduced to reduce a degree of wafer bowing caused by stress due to thermal expansion, which may advantageously affect characteristics of the active layer. Namely, thickness variations in the active layer according to positions may be reduced by reducing curvature of the surface of the first conductivity-type nitride semiconductor layer provided as a growth surface of the active layer. For example, in a case in which a degree of curvature is high, the active layer (in particular, the quantum well layer) may have high thickness variations at an outer circumference and the center of the wafer. This may cause wavelength characteristics to be varied according to wafer regions. In contrast, in the present exemplary embodiment, a problem caused due to wafer bowing may be greatly alleviated by reducing a growth temperature by lowering a volume fraction of hydrogen in the nitrogen source gas.

The second conductivity-type nitride semiconductor layer may be formed on the active layer in operation S80. The second conductivity-type nitride semiconductor layer may be a nitride semiconductor layer satisfying p-type $Al_x$ $In_yGa_{1-x-y}N$ (0≤x<1, 0≤y<1, 0≤x+y<1), and here, a p-type impurity may be magnesium (Mg). For example, the second conductivity-type nitride semiconductor layer may be p-type AlGaN/GaN.

Additionally, the silicon substrate may be removed in operation S90. According to the present exemplary embodiment, in case of the light emitting device, the silicon substrate may absorb light and thereby degrade luminous efficiency. Thus, a scheme of suppressing light absorption by the silicon substrate may be additionally required. For example, as illustrated in the present exemplary embodiment, the silicon substrate may be removed. Prior to the process of removing the silicon substrate, a process of providing a permanent substrate to a surface opposing the surface on which the silicon substrate is positioned may be additionally performed (please refer to FIGS. 21 and 22).

The method of manufacturing a nitride semiconductor light emitting device may be variously modified and implemented. For example, after the stress compensation layer is formed and before the active layer is grown, a first conductivity-type nitride semiconductor layer (for example, n-type nitride semiconductor layer) may have a V-pit structure. A specific example will be described with reference to FIGS. 12 and 13.

Figure 12:
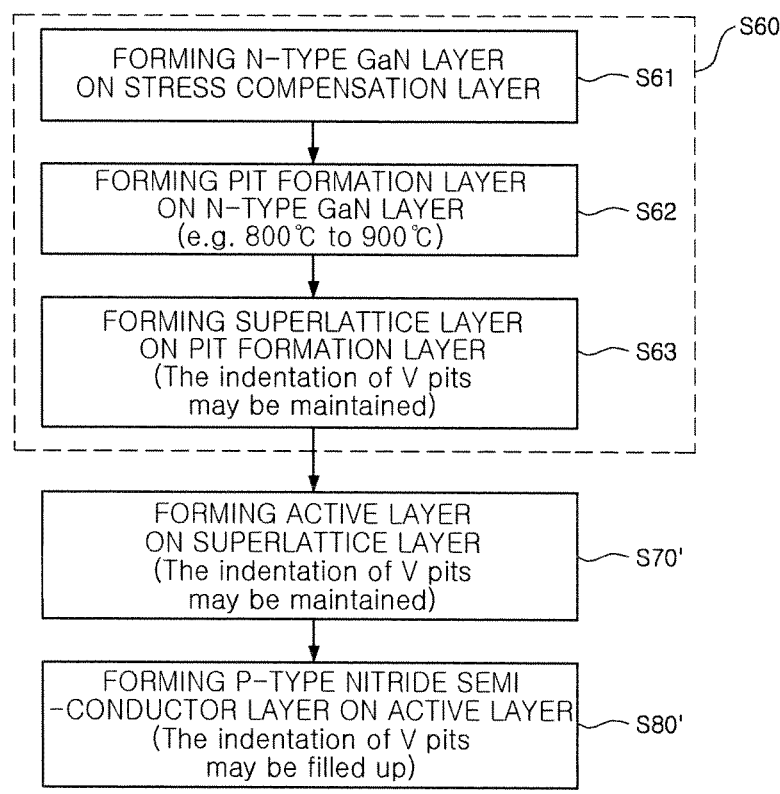
FIG. 12 is a flow chart illustrating a method of manufacturing a nitride semiconductor light emitting device according to another exemplary embodiment of the present inventive concept.
Figure 13:
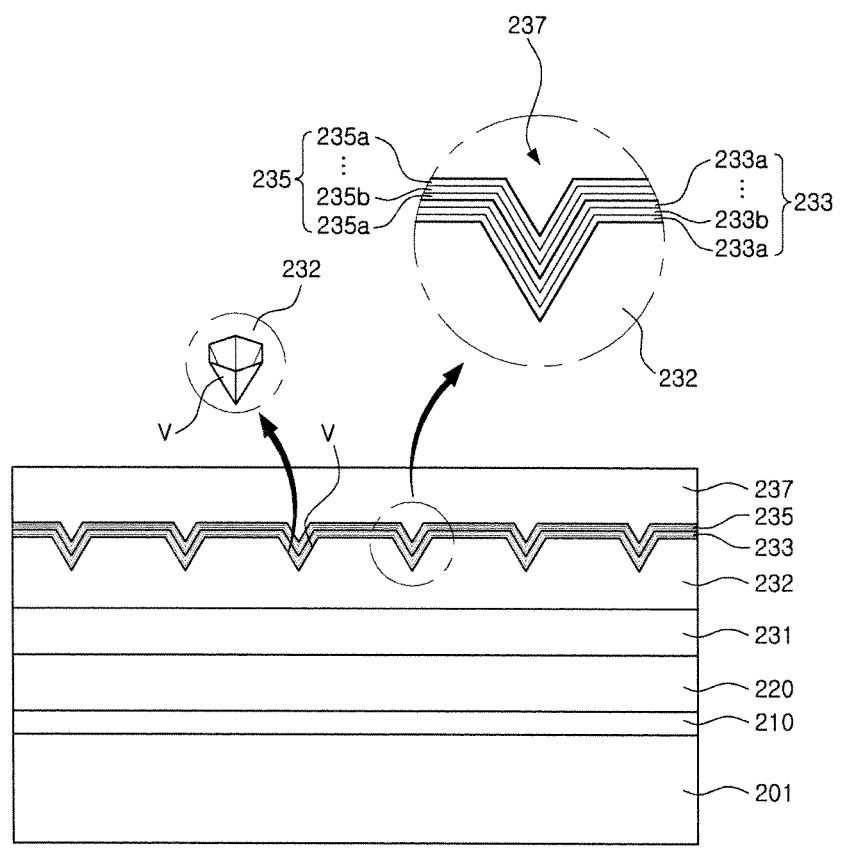
FIG. 13 is a cross-sectional view illustrating a nitride semiconductor light emitting device obtained according to the manufacturing method of FIG. 12.

FIG. 12 is a flow chart illustrating a method of manufacturing a nitride semiconductor light emitting device according to another exemplary embodiment of the present inventive concept, and FIG. 13 is a cross-sectional view illustrating a nitride semiconductor light emitting device obtained according to the manufacturing method of FIG. 12.

As illustrated in FIG. 13, a buffer layer 210 and a stress compensation layer 220 may be sequentially formed on a silicon substrate 201. In the present exemplary embodiment, components may be understood as being identical or similar to those described above with reference to FIGS. 4 through 7 and the matters of the exemplary embodiment described above may be combined with descriptions of the present exemplary embodiment, unless otherwise mentioned.

A first conductivity-type nitride semiconductor layer 231 may be grown on the stress compensation layer 220 in operation S61.

The first conductivity-type nitride semiconductor layer 231 may be a nitride single crystal having a composition of $Al_xIn_yGa_{1-x-y}N$ (0≤x≤1, 0≤y≤1, 0≤x+y≤1). The first conductivity-type nitride semiconductor layer may be n-type GaN. An n-type impurity concentration of the first conductivity-type nitride semiconductor layer may be $2\times10^{18}/cm^3$ or greater.

Next, a pit formation layer 232 having a plurality of V pits may be grown on the first conductivity-type nitride semiconductor layer 231 in operation S62.

The pit formation layer 232 may be a nitride single crystal having a composition of $Al_xIn_yGa_{1-x-y}N$ (0≤x≤1, 0≤y≤1, 0≤x+y≤1) doped with an n-type impurity. For example, the pit formation layer 232 may be n-type GaN, similar to the first conductivity-type nitride semiconductor layer 231. The V pits may have a hexagonal pyramid shape. In a specific example, a sloped surface of each pit V may be (1-101) face. The V pit V may be formed by growing the pit formation layer 232 at a relatively low temperature. For example, the pit formation layer 232 may be grown at a temperature 950° C., further, at a temperature ranging from 800° C. to 900° C. During the low temperature crystal growth stage, V pits may be generated in a process of resolving tensile stress. The V pits V may be generated at positions corresponding to dislocation of the first conductivity-type nitride semiconductor layer 231.

In order to enhance crystallinity, the pit formation layer 232 may have an impurity concentration lower than that of the first conductivity-type nitride semiconductor layer 231. For example, an n-type impurity concentration of the pit formation layer 232 may be $1 \times 10^{18}/cm^3$ or less.

Thereafter, a superlattice layer 233 may be formed on the pit formation layer such that the indentation based on V pits V may be maintained in operation S63.

The superlattice layer 233 may be formed by alternately stacking first and second nitride films 233a and 233b having different compositions. The first and second nitride films 233a and 233b may be formed of $Al_xIn_yGa_{1-x-y}N$ (0≤x≤1, 0≤y≤1, 0≤x+y≤1) having different compositions, respectively. The superlattice layer 233 may be doped with an n-type impurity such as silicon (Si) or undoped.

In an example, the first nitride film 233a may be formed of $In_yGa_{1-y}N$ (0<y≤1) and the second nitride film 233b may be formed of GaN. In another example, the first nitride film 233a may be formed of GaN and the second nitride film 233b may be formed of $Al_xGa_{1-x}N$ (0<x≤1). The superlattice layer 233 may include three different types of nitride film. For example, the superlattice layer may be formed by repeatedly stacking AlGaN/GaN/InGaN.

In a specific example, the first and second nitride films 233a and 233b of the superlattice layer 233 may be formed of a nitride semiconductor having a composition identical or similar to that of the quantum barrier 235a and/or the quantum well layer 235b of the active layer 235. Thicknesses of the first and second nitride films 233a and 233b may range from approximately 0.5 nm to approximately 20 nm. The first nitride film 233a may be thinner than the second nitride film 233b.

Subsequently, the active layer 235 may be formed on the superlattice layer 233 such that the indentation based on the V pits V may be maintained in operation S70'.

The active layer 235 may be a single quantum well layer (SQW) or a multi-quantum well (MQW) structure. In case of the MQW structure, the active layer 235 may include a plurality of quantum barrier layers 235a and a plurality of quantum well layers 235b. For example, the active layer 235 may have an InGaN/GaN structure. When the active layer 235 is formed, a vertical growth rate and a lateral growth rate may be adjusted not to fill up the V pits to thus maintain the indentation based on the plurality of V pits. The growth rate may be adjusted by a growth temperature, pressure, and a flow rate of a precursor. For example, in case of adjusting a growth temperature, a low temperature growth (950° C. or lower) may be desirous.

However, growth at a slightly high temperature (higher than 950° C.) may be required according to a composition. For example, in case of forming an InGaN quantum well layer and a GaN quantum barrier layer, a process is performed at a temperature range from 800° C. to 1050° C. and, herein, the process of forming the GaN quantum barrier layer may be performed at a relatively high temperature.

Thereafter, a second conductivity-type nitride semiconductor layer 237 may be formed on the active layer 235 (S80') such that the indentation of the V pits V may be filled up.

The second conductivity-type nitride semiconductor layer 237 may be a nitride single crystal having a composition of $Al_xIn_yGa_{1-x-y}N$ (0≤x≤1, 0≤y≤1, 0≤x+y≤1) doped with a p-type impurity. Magnesium (Mg) may be used as the p-type impurity. This process may be performed at a relatively high temperature (1000° C. or higher) to fill up the V pits V using the second conductivity-type nitride semiconductor layer 237.

For example, the second conductivity-type nitride semiconductor layer 237 may be formed as including first and second layers. The second layer may be a contact layer such as p-type GaN, and the first layer may be a planarization layer filling up the V pits. In particular, the first layer may be formed of a nitride layer having a large band gap so as to be utilized as an electron blocking layer. In an example, the electron blocking layer may be a p-type AlGaN layer. In another example, the first layer may have a superlattice structure in which two layers having different compositions are repeatedly stacked. For example, the first layer may have a superlattice structure including p-type AlGaN/GaN.

The scheme of limiting supply of a hydrogen gas proposed by the inventor of the present application may also be applied to the growth process of the first conductivity-type nitride semiconductor layer (e.g., in step S60), as well as to that of the lattice buffer layer (e.g., in step S40), part of the buffer layer (e.g., in step S40), and the stress compensation layer (e.g., in step S50). In particular, the scheme of limiting supply of a hydrogen gas may be advantageously applied to the first conductivity-type nitride semiconductor layer to grow as a high quality crystal at a growth temperature of 1040° C. or lower.

Meanwhile, in a case in which a corresponding layer is inherently grown at a low temperature or in a case in which hydrogen is not provided in the nitrogen source gas, the scheme of limiting supply of a hydrogen gas may not be applied. For example, although the pit formation layer is formed of n-type GaN, the pit formation layer is grown at a relatively low temperature (950° C.) to form the V pits, and thus, the scheme of limiting supply of a hydrogen gas may not be applied thereto. Also, in case of forming a nitride semiconductor layer containing indium (In) like quantum well layer, since a hydrogen gas is not contained in the nitrogen source gas, the scheme of limiting supply of a hydrogen gas may not be applied. In this manner, even though a volume fraction condition (40% or less) of a hydrogen gas is not applied to certain process stages, a growth temperature in the corresponding stage may be controlled to be 1040° C. to suppress a melt-back phenomenon.

In order to specifically verify the effects obtained by lowering a volume fraction of hydrogen in the nitrogen source gas in the method of manufacturing a nitride semiconductor light emitting device according to the present exemplary embodiment, Experiment 2 was conducted.

Experiment 2: Method of Manufacturing Nitride Semiconductor Light Emitting Device A laminate (including n-type GaN/active layer/p-type AlGaN/p-type GaN) for a nitride semiconductor light emitting device was formed, together with a buffer layer and a stress compensation layer, on a (111) face of a silicon substrate by using MOCVD equipment.

First, an AlN nucleation layer (approximately 100 nm) was formed on the (111) face of the silicon substrate and an $Al_{0.3}Ga_{0.7}N$ (approximately 410 nm)/AlN (approximately 40 nm)/$Al_{0.3}Ga_{0.7}N$ (approximately 410 nm) were formed as lattice buffer layers on the AlN nucleation layer. Subsequently, an undoped GaN layer (approximately 0.6 μm)/$Al_{0.5}Ga_{0.5}N$ intermediate layer (approximately 100 nm)/undoped GaN layer (approximately 0.6 μm) were formed as a stress compensation layer. Subsequently, an n-type GaN layer (approximately 3.5 μm)/active layer/p-type AlGaN/p-type GaN were additionally formed.

In this experiment, a nitride laminate was formed on the silicon substrate by using an MOCVD process under the same conditions. However, in Improved Example 2, flow rates of hydrogen gas, ammonia ($NH_3$), and nitrogen ($N_2$) were set to 60 L/min, 40 L/min, and 85 L/min, respectively, and in Comparative Example 2, flow rates of hydrogen gas, ammonia ($NH_3$), and nitrogen ($N_2$) were set to approximately 150 L/min, 30 L/min, and 65 L/min, respectively. In Improved Example 2, a temperature to grow nitride up to n-type GaN layer was maintained at approximately 1,030° C., and a growth temperature in Comparative Example 2 was maintained at approximately 1,050° C., which is slightly higher.

Figure 14A:
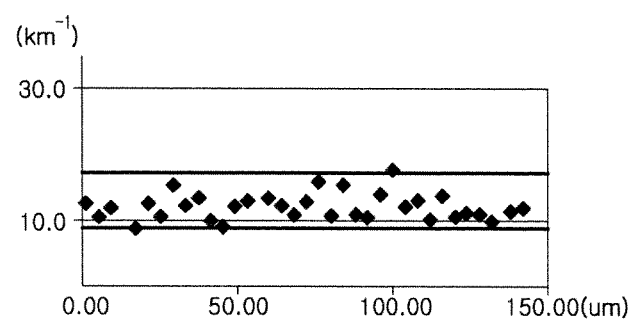
FIGS. 14A and 14B are graphs illustrating distributions of curvatures in interfaces between n-type GaN layers and active layers of a plurality of runs of nitride semiconductor light emitting devices obtained according to Improved Example 2 and Comparative Example 2.
Figure 14B:
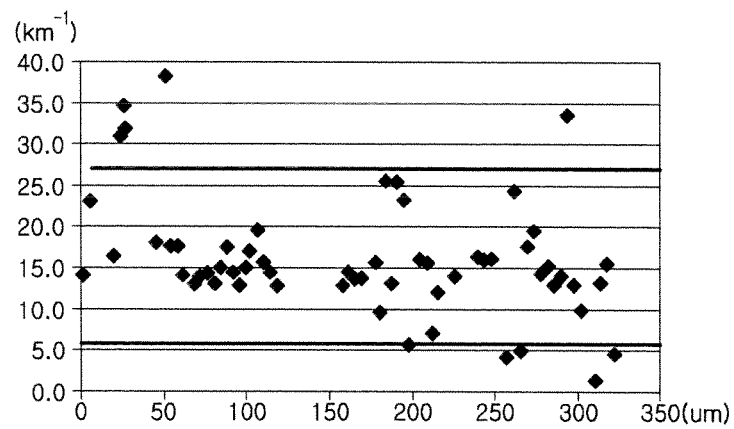

First, the experiment was repeatedly conducted in a plurality of runs satisfying the conditions proposed in the experiment, and curvature distributions of manufactured nitride semiconductor light emitting devices were arranged as illustrated in FIGS. 14A and 14B.

FIGS. 14A and 14B illustrate results of measuring distributions of curvatures in interfaces between n-type GaN layers and active layers of nitride semiconductor light emitting devices obtained according to Improved Example 2 and Comparative Example 2.

Referring to FIG. 14A, in case of Improved Example 2, measured curvatures ranged from approximately 9 $Km^{-1}$ to 18 $Km^{-1}$, and a difference between a minimum measurement value and a maximum measurement value was approximately 10 $Km^{-1}$ or less. In contrast, referring to FIG. 14B, in case of Comparative Example 2, measured curvatures even higher than approximately 20 $Km^{-1}$ appeared with high frequency, and a difference between a minimum measurement value and a maximum measurement value was shown to be very high, approximately 35 $Km^{-1}$.

Figure 15:
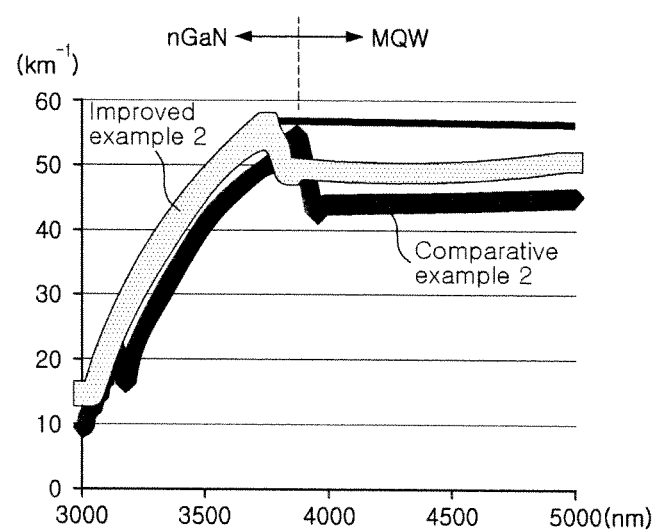
FIG. 15 is a graph illustrating distributions of curvatures in interfaces between n-type GaN layers and active layers of nitride semiconductor light emitting devices obtained according to Improved Example 2 and Comparative Example 2 over a growth time.

FIG. 15 is a graph illustrating distributions of curvatures in interfaces between n-type GaN layers and active layers of one of samples obtained according to Improved Example 2 and Comparative Example 2 over a growth time. As illustrated in FIG. 15, in case of Improved Example 2, a degree of change in curvature when the active layer was grown after the n-type GaN was grown is smaller than that of Comparative Example 2.

The curvature in the interface between the n-type GaN layers and the active layers appeared to even affect variations in a thickness of a nitride single crystal. With respect to the same entire thin film thickness (approximately 3.5 μm), Comparative Example 2 had a thickness variation of approximately 2%, while Improved Example 2 had a significantly smaller thickness variation of 0.8%. This result indicates that a uniform thickness of the active layer is guaranteed in the entire wafer region, and scattering in wavelength characteristics of the nitride semiconductor light emitting device manufactured in the same wafer may be anticipated to be significantly improved.

FIGS. 16 through 22 are cross-sectional views illustrating processes of a method of manufacturing a nitride semiconductor light emitting device according to an exemplary embodiment of the present inventive concept.

Figure 16:
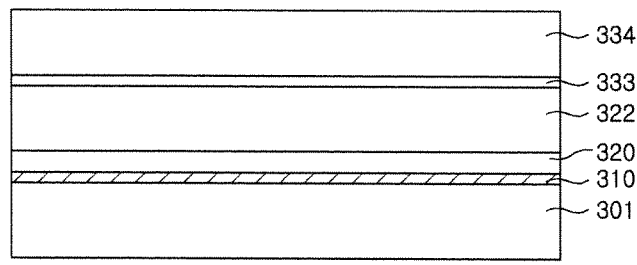
FIGS. 16 through 22 are cross-sectional views illustrating major processes of a method of manufacturing a nitride semiconductor light emitting device according to an exemplary embodiment of the present inventive concept.

As illustrated in FIG. 16, a buffer layer 310 and a stress compensation layer 320 are sequentially formed on a (111) face of a silicon substrate 301, and a light emitting laminate for a nitride semiconductor light emitting device is subsequently formed. The light emitting laminate includes a first conductivity-type nitride semiconductor layer 322, an active layer 333, and a second conductivity-type nitride semiconductor layer 334.

The buffer layer 310 and the stress compensation layer 320 may have various structures, and the examples illustrated in FIGS. 4 through 7 may be referred to as specific examples thereof.

The light emitting laminate may be formed through a continuous process along with the buffer layer 310 and the stress compensation layer 320. For example, a process such as metal-organic chemical vapor deposition (MOCVD), molecular beam epitaxy (MBE), hydride vapor phase epitaxy (HVPE), or the like, may be used. The first conductivity-type nitride semiconductor layer 322 may be a nitride semiconductor satisfying n-type $Al_xIn_yGa_{1-x-y}N$ (0≤x<1, 0≤y<1, 0≤x+y<1), and an n-type impurity may be silicon (Si). For example, the first conductivity-type nitride semiconductor layer 322 may be n-type GaN. The active layer 333 may have a multi quantum well (MQW) structure in which quantum well layers and quantum barrier layers are alternately stacked. For example, in case of a nitride semiconductor, a GaN/InGaN structure may be used. The active layer may have a single quantum well (SQW) structure. The second conductivity-type nitride semiconductor layer 334 may be a nitride semiconductor satisfying p-type $Al_xIn_yGa_{1-x-y}N$ (0≤x<1, 0≤y<1, 0≤x+y<1), and a p-type impurity may be magnesium (Mg). For example, the second conductivity-type nitride semiconductor layer may be p-type AlGaN/GaN.

During the process of growing the first conductivity-type nitride semiconductor layer 322, as well as the buffer layer 310 and the stress compensation layer 320, hydrogen having a volume fraction of 40% or less in the nitrogen source gas may be supplied to lower a growth temperature (for example, approximately 1,040° C. or lower) of a nitride single crystal. As a result, as described above in the experiment results (FIGS. 14B and 15), curvature of the interface of the first conductivity-type nitride semiconductor layer 322 may be reduced and a uniform thickness of the grown active layer 333 may be guaranteed.

Figure 17:
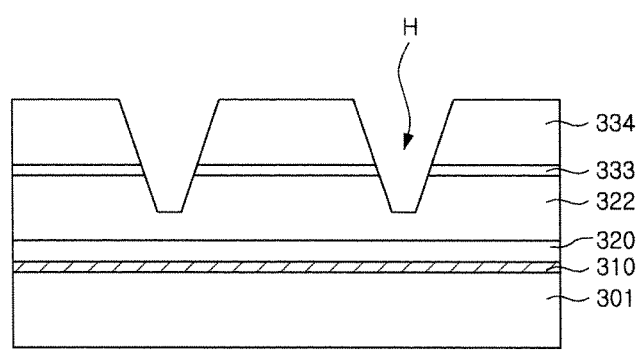

As illustrated in FIG. 17, holes H allowing partial regions of the first conductivity-type nitride semiconductor layer 322 to be exposed are formed in the light emitting laminate.

The holes H may be formed to penetrate through the second conductivity-type nitride semiconductor layer 334 and the active layer 333. The holes H formed during this process constitute a structure for forming electrodes connected to the first conductivity-type nitride semiconductor layer 322.

Figure 18:
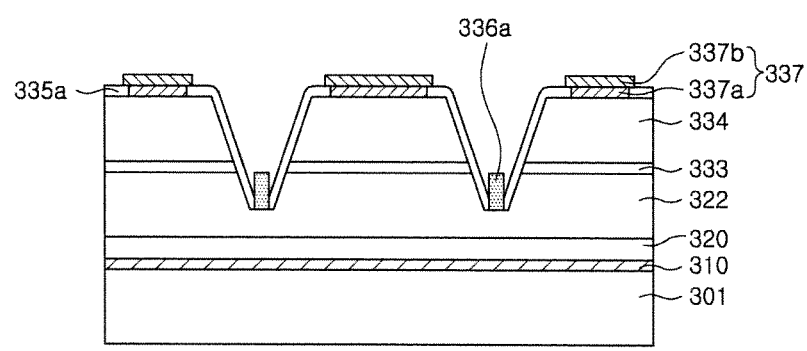

As illustrated In FIG. 18, a first insulating layer 335a is formed on upper surfaces of regions exposed by the holes H and on the second conductivity-type nitride semiconductor layer 334, regions in which electrodes are to be formed are exposed, and first and second electrodes 336a and 337a may be formed to be connected to the first and second conductivity-type nitride semiconductor layers 322 and 334, respectively. The first insulating layer 335a may be formed of an insulating material such as $SiO_2$ or $SiN_x$. Second connection electrodes 337b are additionally formed on the second electrodes 337a to complete a second electrode structure 337.

Figure 19:
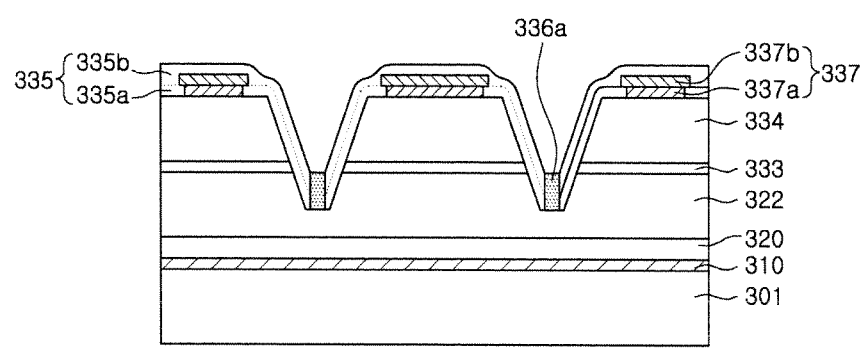

Subsequently, as illustrated in FIG. 19, a second insulating layer 335b may be formed to cover the second electrode structure 337 and expose the first electrodes 336a. The second insulating layer 335b may be obtained by depositing an insulating material on the entire upper surface of the device and selectively removing the insulating material such that only the first electrodes 336a are exposed. The second insulating layer 335b may be formed of an insulating material such as $SiO_2$ or $SiN_x$. The second insulating layer 335b may electrically insulate the second connection electrode 337b to be formed later and the first electrode structure 336, and provide a passivation layer 335 of the device together with the first insulating layer 335a.

Figure 20:
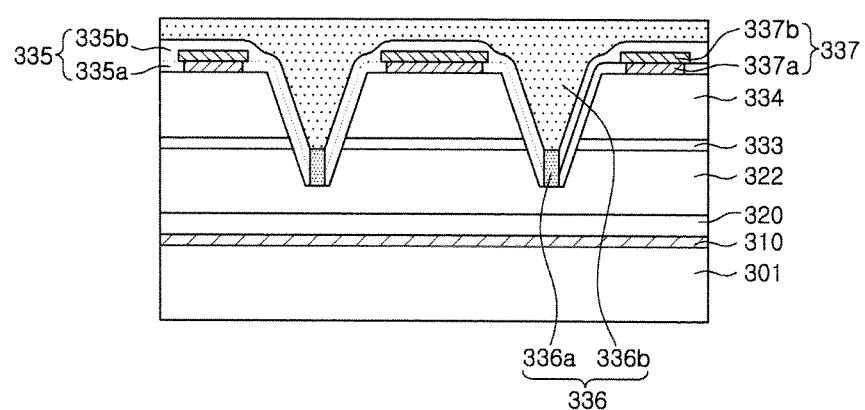

Thereafter, as illustrated in FIG. 20, a first connection electrode 336b connected to the first electrodes 336a may be formed on the upper surfaces of the device, thus providing the first electrode structure 336. The first connection electrode 336b may be electrically connected to the first electrodes 336a through the holes H. In the present exemplary embodiment, the first electrode structure 336 may be positioned in a surface opposing the silicon substrate 301.

Figure 21:
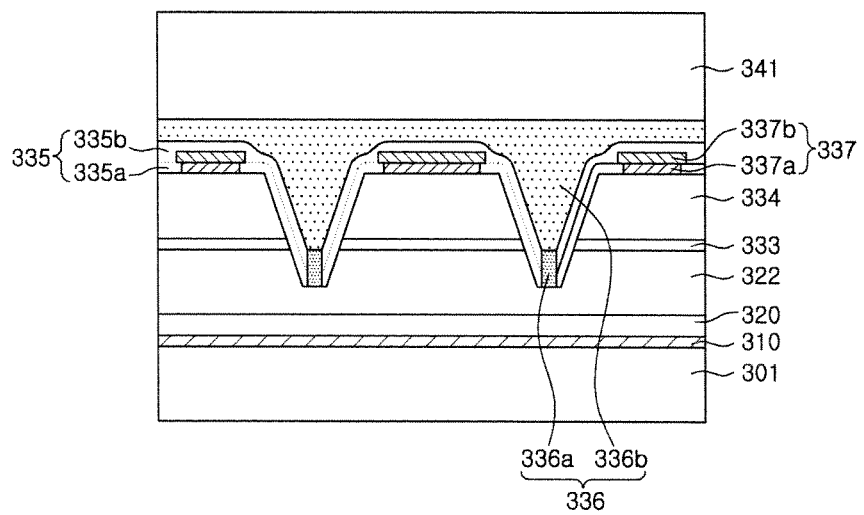
Figure 22:
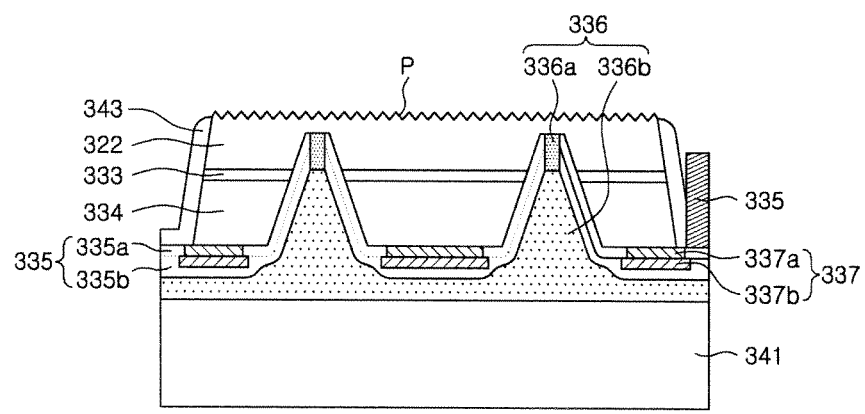

Subsequently, as illustrated in FIGS. 21 and 22, a process of bonding a permanent substrate 341 and a process of removing the silicon substrate 301 may be performed.

As illustrated in FIG. 21, the permanent substrate 341 may be disposed on the first connection electrode 336b. The permanent substrate 341 may be a conductive substrate, and in this case, the permanent substrate 341 may provide a structure connecting the first electrode structure 336 to an external circuit. The permanent substrate 341 may bonded to the light emitting laminate through a wafer bonding process or by using a bonding metal layer. In another example, a conductive permanent substrate may be formed on a surface of the light emitting laminate using a plating process.

Thereafter, as illustrated in FIG. 22, the silicon substrate 301 may be removed. The process of removing the silicon substrate 301 may be performed through a substrate separation process using a laser, a chemical etching process, or a mechanical grinding process. During this process, the buffer layer and the stress compensation layer may also be removed together. As illustrated in the present exemplary embodiment, a depression and protrusion pattern P may be formed on a resultant surface, as needed. The depression and protrusion pattern P may be formed by using dry etching such as reactive ion etching (RIE) or wet etching during the process of removing the buffer layer and the stress compensation layer. Additionally, the light emitting laminate may be divided into device units, and an additional passivation layer 343 may be formed on the exposed lateral surfaces of the light emitting laminate. Also, the second connection electrode 337 may be partially exposed to form a bonding electrode 335 to thus provide a desired nitride semiconductor light emitting device.

The method of manufacturing a nitride semiconductor device as described above may be widely and advantageously applied to manufacturing methods for a Schottky diode, a laser diode, a field effect transistor, or various power devices, as well as to the method of manufacturing the nitride light emitting device as described above with reference to FIGS. 16 through 22.

As set forth above, according to exemplary embodiments of the present inventive concept, a growth temperature may be lowered by lowering a volume fraction of hydrogen in a nitrogen source gas, while maintaining crystal quality. Thus, deformation caused by a difference in coefficients of thermal expansion between a substrate and a nitride single crystal may be suppressed. Also, variations in a thin film thickness caused due to occurrence of bowing (increase in curvature) may be significantly reduced. In particular, since a thin film (in particular, an active layer) may be implemented to have a uniform thickness in a nitride semiconductor light emitting device, desired characteristics such as an emission wavelength may be uniformly implemented in the entire area. In addition, a melt-back phenomenon, one of problems of a silicon substrate when a nitride crystal is grown, may be considerably alleviated.

While exemplary embodiments have been shown and described above, it will be apparent to those skilled in the art that modifications and variations could be made without departing from the spirit and scope of the present inventive concept as defined by the appended claims.

What is claimed is:

1. A method of growing a Group-III nitride semiconductor, the method comprising steps of:
    forming an AlN nucleation layer on a substrate containing silicon (Si);
    forming a lattice buffer layer on the AlN nucleation layer, the lattice buffer layer being formed of a nitride crystal containing aluminum (Al);
    forming a stress compensation layer on the lattice buffer layer; and
    forming a light emitting structure on the stress compensation layer by performing steps of:
        forming a first conductivity-type nitride semiconductor layer on the stress compensation layer;
        forming an active layer on the first conductivity-type nitride semiconductor layer; and
        forming a second conductivity-type nitride semiconductor layer on the active layer,
    wherein the step of forming the lattice buffer layer is performed by providing concurrently with a metal source gas, to an interior of a reaction chamber having the substrate, a nitrogen source gas having a volume fraction of hydrogen in a range of 20% to 40%, while maintaining the substrate at the temperature of 950° C. to 1040° C.,
    wherein the metal source gas is provided to the substrate via a metal source gas supply line and the nitrogen source gas is provided to the substrate via a nitrogen source gas supply line that is separate from the metal source gas supply line.

2. The method of claim 1, wherein the step of forming the stress compensation layer on the buffer layer comprises:
    forming, on the lattice buffer layer, a first nitride semiconductor layer having a lattice constant greater than that of the lattice buffer layer;
    forming, on the first nitride semiconductor layer, an intermediate layer including a nitride crystal having a lattice constant smaller than that of the first nitride semiconductor layer; and
    forming, on the intermediate layer, a second nitride semiconductor layer having a same composition as the first nitride semiconductor layer.

3. The method of claim 1, further comprising:
    mounting the light emitting structure on a permanent substrate by bonding the second conductivity-type nitride semiconductor layer to the permanent substrate; and removing the silicon substrate, the buffer layer, and the stress compensation layer to expose the first conductivity-type nitride semiconductor layer of the light emitting structure.

4. The method of claim 1, wherein the nitrogen source gas has a volume fraction of hydrogen in a range of 20% to 35%, and wherein the substrate is maintained at a temperature of 970° C. to 1035° C.

5. A method of forming a nitride crystal on a substrate, the method comprising steps of:

forming, on a surface of a substrate containing silicon, a buffer layer including a nucleation layer and a lattice buffer layer; and forming a stress compensation layer on the lattice buffer layer, the step of forming the stress compensation layer comprising sequentially forming a first nitride semiconductor layer having a lattice constant greater than that of the lattice buffer layer, an intermediate layer having a lattice constant smaller than that of the first nitride semiconductor layer, and a second nitride semiconductor layer on the lattice buffer layer such that the second nitride semiconductor layer is directly on the intermediate layer, and forming a light emitting structure on the second nitride semiconductor layer by performing steps of:

forming a first conductivity-type nitride semiconductor layer on the second nitride semiconductor layer;

forming an active layer on the first conductivity-type nitride semiconductor layer; and forming a second conductivity-type nitride semiconductor layer on the active layer, wherein at least a portion of the forming of each of the first nitride semiconductor layer, the intermediate layer, and the second nitride semiconductor layer is performed by providing a nitrogen source gas including hydrogen provided at a flow rate of 20000 sccm to 70000 sccm while maintaining the substrate at a temperature of 950° C. to 1040° C.

6. The method of claim 1, wherein melt-back defects that occur in the nitride crystal have an average size of 400 μm or less.

7. The method of claim 6, wherein the nitride crystal is formed to have no more than 1% of melt-back defects having a diameter of 400 μm or greater.

8. The method of claim 6, wherein at least a portion of the forming of each of the first nitride semiconductor layer, the intermediate layer, and the second nitride semiconductor layer is performed by concurrently providing, to an interior of a reaction chamber having the substrate, a metal source gas and a nitrogen source gas wherein the nitrogen source gas has a volume fraction of hydrogen in a range of 20% to 40%.

9. The method of claim 5, wherein the lattice buffer layer is formed of a nitride crystal containing aluminum (Al).

10. The method of claim 5, wherein the step of forming the lattice buffer layer is performed by providing concurrently with a metal source gas, to an interior of a reaction chamber having the substrate, a nitrogen source gas having a volume fraction of hydrogen in a range of 20% to 40%, while maintaining the substrate at the temperature of 950° C. to 1040° C.

* * * * *